(12) United States Patent
Masaki et al.

(10) Patent No.: US 7,091,507 B2
(45) Date of Patent: Aug. 15, 2006

(54) LIGHT GENERATOR AND EXPOSURE APPARATUS

(75) Inventors: Fumitaro Masaki, Tochigi-ken (JP); Akira Miyake, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/060,198

(22) Filed: Feb. 17, 2005

(65) Prior Publication Data
US 2005/0178979 A1 Aug. 18, 2005

(30) Foreign Application Priority Data
Feb. 18, 2004 (JP) ............................. 2004-042142

(51) Int. Cl.
*H05H 1/00* (2006.01)
*H05H 1/24* (2006.01)
*G21G 4/00* (2006.01)
*G01J 1/00* (2006.01)

(52) U.S. Cl. .............................. 250/504 R; 250/461.1; 250/492.1; 250/493.1; 362/263; 362/266

(58) Field of Classification Search ..................... None
See application file for complete search history.

(56) References Cited

U.S. PATENT DOCUMENTS

| | | | | |
|---|---|---|---|---|
| 5,654,998 | A * | 8/1997 | Turcu et al. ................. | 378/119 |
| 5,757,016 | A * | 5/1998 | Dunn et al. ............... | 250/492.1 |
| 6,156,030 | A * | 12/2000 | Neev ............................ | 606/10 |
| 6,320,937 | B1 * | 11/2001 | Mochizuki .................. | 378/143 |
| 6,324,256 | B1 | 11/2001 | McGregor et al. | |
| 6,987,279 | B1 * | 1/2006 | Hoshino et al. ........ | 250/504 R |
| 2002/0094063 | A1 * | 7/2002 | Nishimura et al. .......... | 378/119 |
| 2004/0108473 | A1 * | 6/2004 | Melnychuk et al. .... | 250/504 R |
| 2004/0129896 | A1 * | 7/2004 | Schmidt et al. .......... | 250/492.2 |
| 2004/0238762 | A1 * | 12/2004 | Mizoguchi et al. ..... | 250/504 R |
| 2005/0105290 | A1 * | 5/2005 | Tsuji .......................... | 362/268 |
| 2005/0167618 | A1 * | 8/2005 | Hoshino et al. ........ | 250/504 R |
| 2005/0178979 | A1 * | 8/2005 | Masaki et al. ........... | 250/492.1 |
| 2005/0199829 | A1 * | 9/2005 | Partlo et al. ............ | 250/504 R |
| 2005/0199830 | A1 * | 9/2005 | Bowering et al. ....... | 250/504 R |
| 2005/0205810 | A1 * | 9/2005 | Akins et al. ............ | 250/504 R |
| 2005/0230645 | A1 * | 10/2005 | Melnychuk et al. .... | 250/504 R |
| 2005/0236584 | A1 * | 10/2005 | Tsuji ...................... | 250/492.1 |
| 2006/0011870 | A1 * | 1/2006 | Yamamoto et al. ..... | 250/504 R |

FOREIGN PATENT DOCUMENTS

JP 2002-174700 A 6/2002

OTHER PUBLICATIONS

R. H. Moyer et al.; "Laser-Produced Plasma (LPP) Scale-up and Commercialization"; *Proceedings of SPIE*; vol. 4343; (2001); pp. 249-251.

* cited by examiner

*Primary Examiner*—John R. Lee
*Assistant Examiner*—Bernard E. Souw
(74) *Attorney, Agent, or Firm*—Morgan & Finnegan LLP

(57) ABSTRACT

A light generator for irradiating a laser onto a target, for generating plasma, and for producing light from the plasma, includes a first optical system for introducing the light to the target, a second optical system for introducing the light, and a unit for irradiating the laser onto debris that attaches to at least one of the first and second optical systems by changing an irradiation condition of the laser differently from that used to generate the plasma.

24 Claims, 20 Drawing Sheets

LIGHT GENERATOR AND EXPOSURE APPARATUS

BACKGROUND OF THE INVENTION

The present invention relates generally to a light generator, and more particularly to a light source used to transfer a fine pattern in the semiconductor manufacture. The present invention is suitable, for example, for an exposure apparatus that utilizes the X-ray and the extreme ultraviolet ("EUV") light as a light source.

A reduction projection exposure apparatus has been conventionally employed which uses a projection optical system to project a circuit pattern of a mask (reticle) onto a wafer, etc. to transfer the circuit pattern, in manufacturing such a fine semiconductor device as a semiconductor memory and a logic circuit in the photolithography technology.

The minimum critical dimension to be transferred by the projection exposure apparatus or resolution is proportionate to a wavelength of the light used for exposure, and inversely proportionate to the numerical aperture ("NA") of the projection optical system. The shorter the wavelength is, the better the resolution is. Along with the recent demands for the finer semiconductor devices, a shorter wavelength of ultraviolet ("UV") light has been promoted from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the UV light has to satisfy the rapid advancement of the fine processing of a semiconductor device, and a reduction projection optical system using the EUV light with a wavelength of 10 to 15 nm shorter than that of the UV light (referred to as an "EUV exposure apparatus" hereinafter) has been developed to efficiently transfer a very fine circuit pattern of 0.1 μm or less. The EUV light source uses, for example, a laser plasma light source that irradiates a high-intensity pulsed laser light onto a target material, such as a metal thin coating, inert gases and liquid drops, in the vacuum chamber, generates the high-temperature plasma, and uses the EUV light having a wavelength of, for example, about 13 nm (see, for example, Japanese Patent Application, Publication No. 2002-174700, and Richard H. Moyer et al., Proceeding of SPIE Vol. 4343 (2001), pp. 249–251.

The laser plasma as one mode of the EUV light source irradiates the high-strength pulse laser light onto the target material and generates not only the EUV light from the target material but also flying particles called debris, which are made of gasified, liquidized and ionized target materials, and cause contaminations, damages and lowered reflectance of an optical element. A supply mechanism that supplies the target material also emits the debris (flying particle).

When the debris attaches to the laser optical system that introduces the pulsed laser light to the target material, the attached debris scatters and absorbs the pulsed laser beam. This configuration cannot supply the energy necessary to generate the plasma to the target material and stably generate the EUV light.

BRIEF SUMMARY OF THE INVENTION

Accordingly, it is an illustrative object of the present invention to provide a light generator and exposure apparatus that satisfactorily eliminates the debris and stably generates the EUV light.

A light generator according to one aspect of the present invention for irradiating a laser onto a target, for generating plasma, and for producing light from the plasma, includes a first optical system for introducing the light to the target, a second optical system for introducing the light, and a unit for irradiating the laser onto debris that attaches to at least one of the first and second optical systems by changing an irradiation condition of the laser differently from that used to generate the plasma.

A light generator according to another aspect of the present invention for irradiating an excitation laser onto a target in a vacuum, for generating plasma, and for producing light from the plasma includes an optical system for introducing the excitation laser to the target, and an irradiation mechanism for irradiating a laser different from the irradiation of the excitation laser onto debris that attaches to the optical system.

A removing method according to another aspect of the present invention for removing debris that is generated together with light having a wavelength of 20 nm or smaller from plasma as a result of irradiating a laser onto a target and generating the plasma, includes the steps of detecting an amount of the debris that attaches to an optical system for introducing the laser to the target, changing a condensing condition of the laser when the amount of the debris detected by the detecting step is greater than a predetermined amount, and irradiating the laser having the condensing condition changed by the changing step, onto a position to which the debris attaches.

A removing method according to still another aspect of the present invention for removing debris that is generated together with light having a wavelength of 20 nm or smaller from plasma as a result of irradiating a laser onto a target and generating the plasma, includes obtaining a relationship between the number of emissions of the laser and an amount of the debris that attaches to the optical system for introducing the laser to the target, determining, based on the relationship, whether the debris that attaches to the optical system should be removed, changing a condensing condition of the laser when the determining step determines that the debris that attaches to the optical system should be removed, and irradiating the laser having the condensing condition changed by the changing step, onto the debris that attaches to the optical system.

An exposure apparatus according to another aspect of the present invention for exposing a pattern of a reticle onto an object, includes the above light generator, and an optical system for illuminating the reticle using light taken by the light generator.

A device manufacturing method according to another aspect of the present invention includes the steps of exposing an object to be exposed using the above exposure apparatus, and developing the object exposed. Claims for a device fabricating method for performing operations similar to that of the above exposure apparatus cover intermediate and final products devices. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
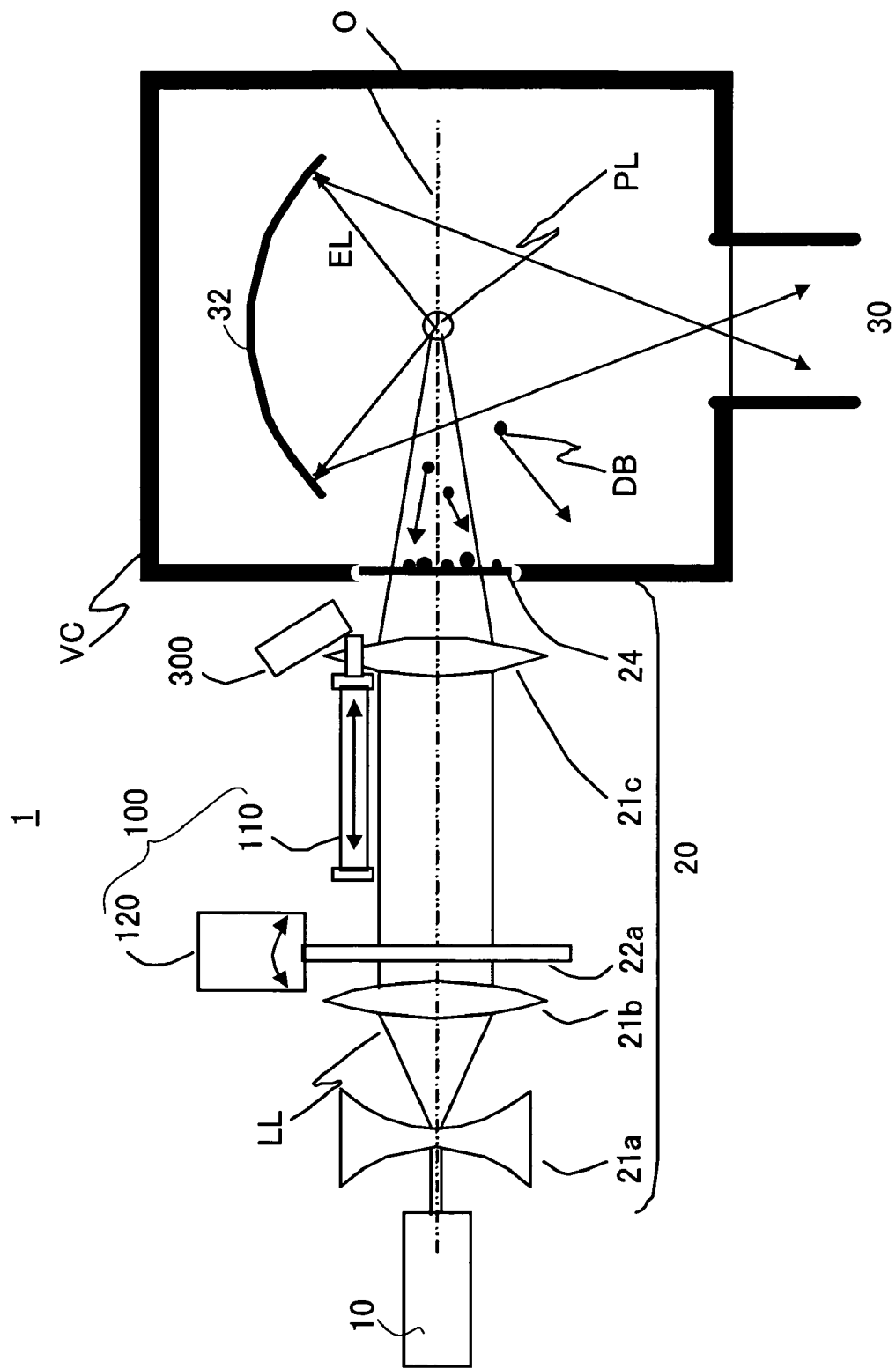
FIG. 1 is a schematic block diagram of a structure of a light generator according to one aspect of the present invention.
Figure 2:
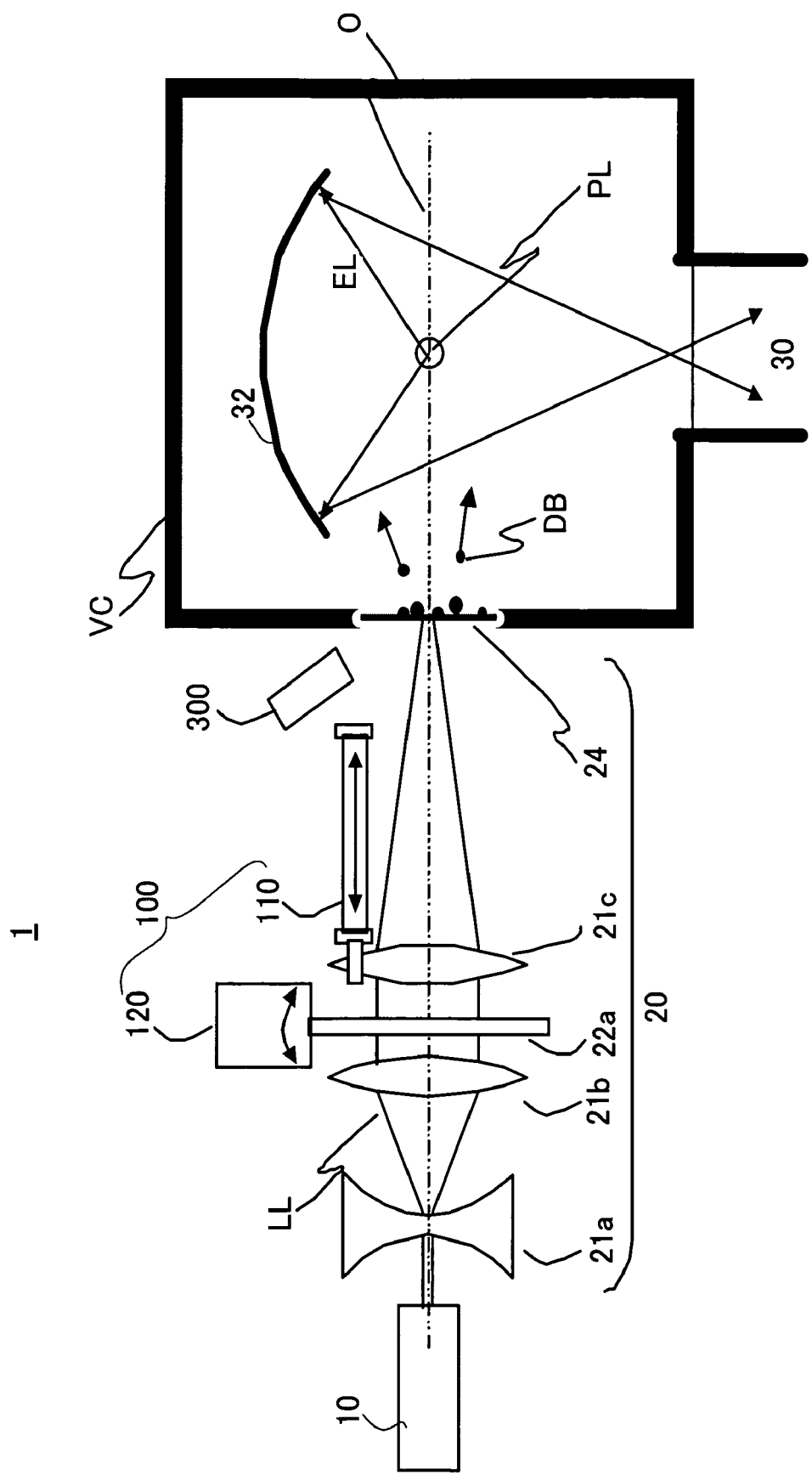
FIG. 2 is a schematic block diagram of a structure of a light generator according to one aspect of the present invention.
Figure 3:
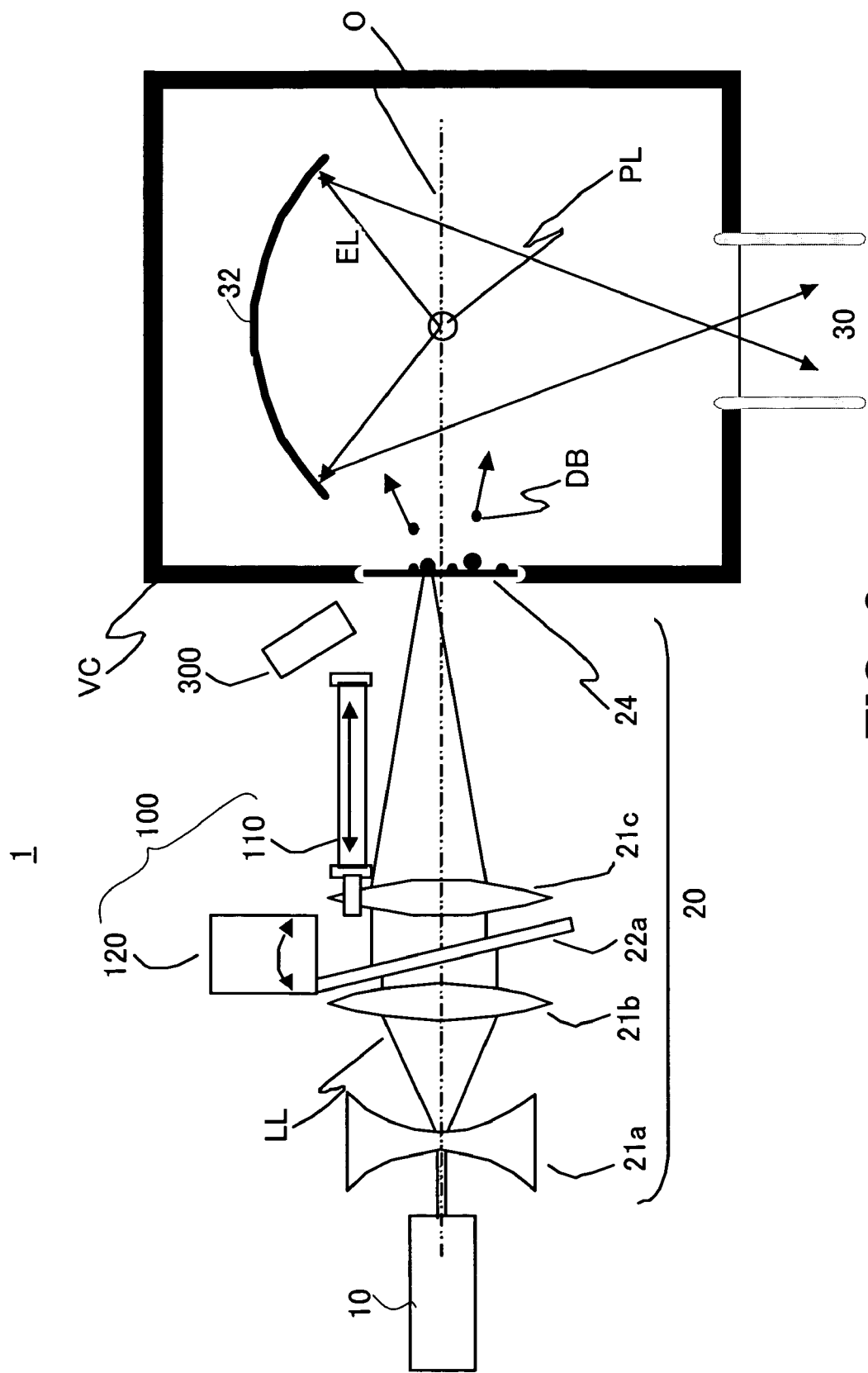
FIG. 3 is a schematic block diagram of a structure of a light generator according to one aspect of the present invention.

Referring now to the accompanying drawings, a description will be given of the preferred embodiments of the present invention. Like elements are designated by the same reference numerals, and a duplicate description will be omitted. FIG. 1 is a schematic block diagram of a structure of a light generator 1 according to one aspect of the present invention, showing an emitting state of the EUV light EL. FIGS. 2 and 3 are schematic diagrams of the structure of the light generator 1 according to one aspect of the present invention, which is removing debris DB from a laser introducing window 24.

The light generator 1 is one that irradiates the laser light LL onto a target, generates the plasma PL, and producing the EUV light EL from the plasma PL. The light generator 1 includes a laser light source section 10 that irradiates the laser light LL onto the target, a laser optical system 20 as a first optical system that introduces the laser light LL to the target, an EUV optical system 30 as a second optical system that introduces the EUV light EL, an irradiation condition changing means 100, and a detecting means 300.

Referring to FIG. 1, the laser light LL emitted from the laser light source 10 condenses onto the target via the laser optical system 20. The target is made of solid copper in this embodiment, but may be another metal (such as tin and aluminum), Xe gases, liquid drops, or clusters. The target is intermittently supplied from a target supplier (not shown) in synchronization with emissions of the laser light LL of the laser light source 10.

The energy from the laser light LL generates the high-temperature and high-density plasma PL from the target, and emits the EUV light EL from the plasma PL. The EUV light EL is condensed by a condenser mirror 32, and supplied to a subsequent optical system (or the EUV optical system 30). In this embodiment, the condenser mirror 32 that condenses the EUV light EL is part of the EUV optical system 30.

The laser optical system 20 includes a lens, a mirror, a plane-parallel glass plate, etc., and uses lenses 21a to 21c and plane-parallel glass plate 22a in this embodiment. The laser optical system 20 includes the laser introducing window 24 that is used for part of the vacuum diaphragm for a vacuum chamber VC and transmits the laser light LL.

The laser optical system 20 is installed in the air or in a vacuum. In order to efficiently take out the EUV light EL, the laser optical system 20 serves to adjust a spot size and energy density of the laser light LL necessary and enough to generate the plasma PL from the target.

The plasma PL generates the debris from the target, i.e., copper debris and debris from the target supply mechanism (collectively "debris DB") in addition to the EUV light EL. The generated debris DB gradually attaches to and deposits on the laser introducing window 24 and the condenser mirror 32.

The debris DB that attaches to the laser introducing window 24 obtains the energy from the laser light LL at the time of plasma PL generation. The laser light LL condenses on or near the target, and has a wide irradiation area on the laser introducing window 24. Therefore, at the time of the plasma PL generation, the energy density per unit area of the laser light LL on the laser introducing window 24 is not so high that the debris DB does not receive the sufficient energy and the effective removal of the debris from the laser introducing window 24 cannot be expected.

The irradiation condition changing means 100 changes the irradiation condition of the laser light LL differently from that for the plasma PL generation. More specifically, the condensing position of the laser light LL is made different from that for the plasma PL generation so that the laser light LL condenses on the debris attaching surface of the laser introducing window 24. Thereby, the energy concentrates on the debris DB that attaches to the laser introducing window 24 from the laser light LL, and the debris DB can be removed from the laser introducing window 24.

The irradiation condition changing means 100 is implemented, for example, by a drive mechanism that drives the lenses 21a to 21c in the laser optical system 20 in a direction parallel to the optical axis O of the laser light LL, and a drive mechanism that inclines the plane-parallel glass plate 22a of the laser optical system 20 relative to the optical axis O of the laser light LL. In this embodiment, the irradiation condition changing means 100 includes a drive mechanism 110 that drives the lens 21c parallel to the optical axis O as shown in FIG. 2, and a drive mechanism 120 that inclines the plane-parallel glass plate 22a relative to the optical axis O.

The drive mechanism 110 serves to condense the laser light LL on the debris attaching surface of the laser introducing widow 24 by changing a position of the lens 21c. The drive mechanism 120 serves to scan the laser light LL on the laser introducing window 25 by changing an angle of the plane-parallel glass plate 22a. Thereby, the debris DB is removed from the entire laser introducing window 24. However, it is unnecessary to scan the laser light LL on the entire laser introducing window 24, and the debris DB may be removed from part that transmits the laser light LL at the time of emission of the EUV light EL.

Figure 4:
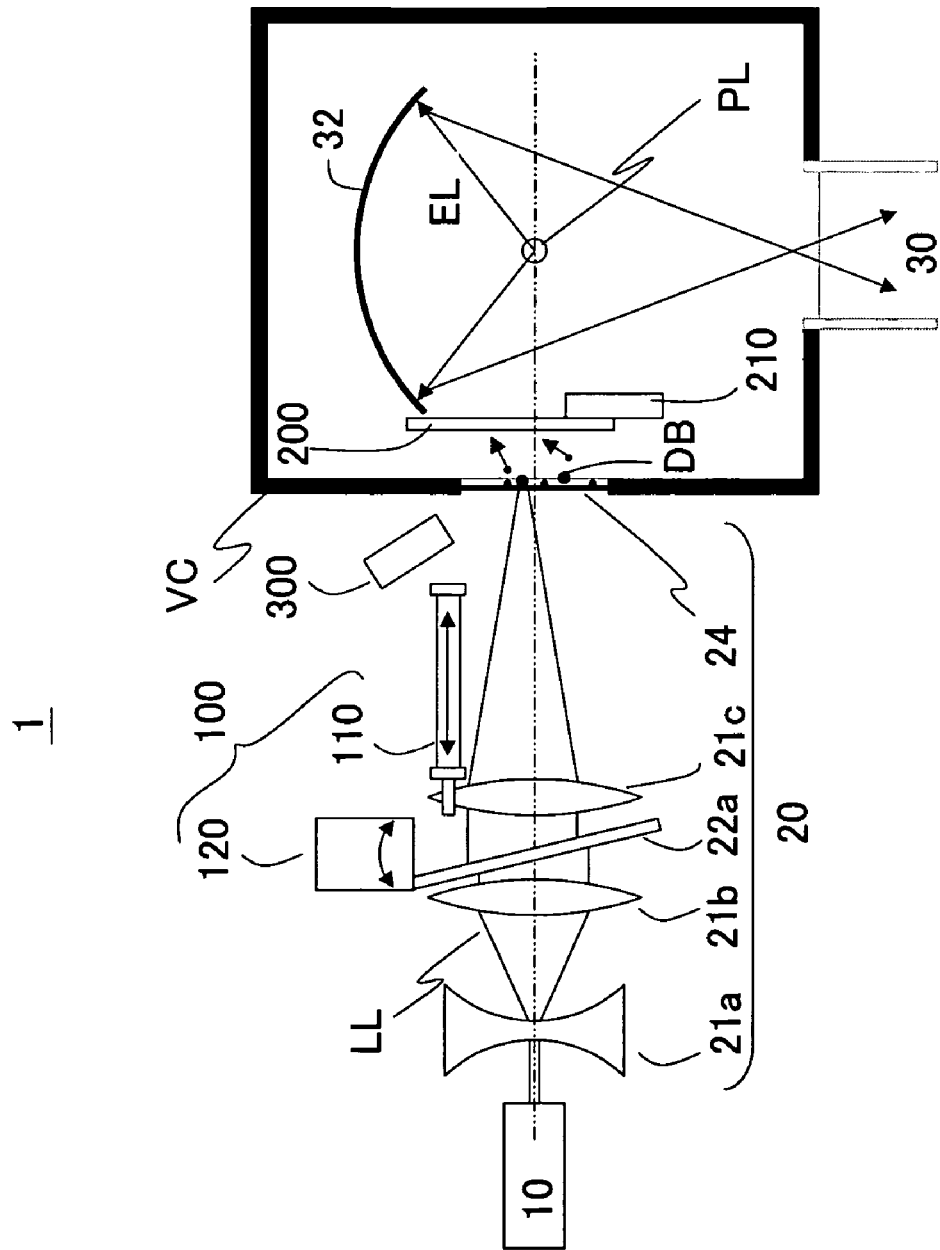
FIG. 4 is a schematic block diagram of a structure of a light generator that has a protector that prevents a reattachment of removed debris.

If the debris DB is removed from the laser introducing window 24, it may possibly reattach to the condenser mirror 32, etc., a protector 200 for absorbing the debris DB is used as shown in FIG. 4. The removable moving mechanism 210 inserts the protector 200 between a position to which the debris DB attaches, i.e., the laser introducing window 24, and an optical element that is to be protected from the reattachment of the debris DB. Thereby, in removing the debris DB from the laser introducing window 24, the protector 200 is inserted between the laser introducing window 24 and the optical element (which is the condenser mirror 32 in this embodiment) to be protected, and the protector 200 is retreated after the removal of the debris DB ends. The protector 200 is made, for example, of a plane glass. Here, FIG. 4 is a schematic block diagram of a structure of the light generator 1 that has the protector 200 that prevents the reattachment of the removed debris DB.

Figure 5:
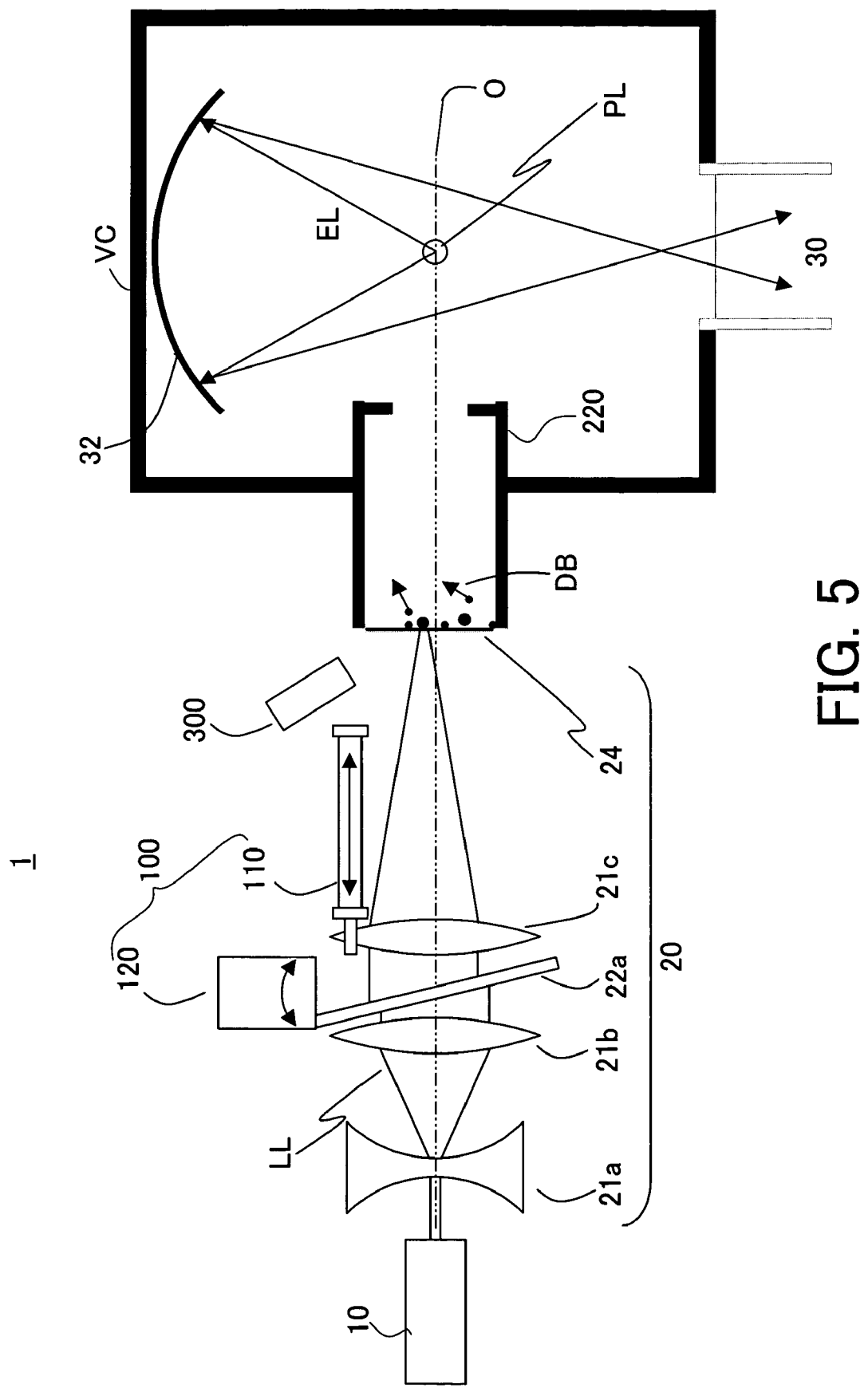
FIG. 5 is a schematic block diagram of a structure of a light generator that has a protecting wall that prevents a reattachment of removed debris.

As shown in FIG. 5, a protection wall 220 may be provided between the laser introducing window 24, to which the debris attaches, and the condenser mirror 32. The protection wall 220 may be part of the vacuum chamber VC. Here, FIG. 5 is a schematic block diagram of the structure of the light generator 1 having the protection wall 220 that prevents the reattachment of the removed debris DB.

Figure 6:
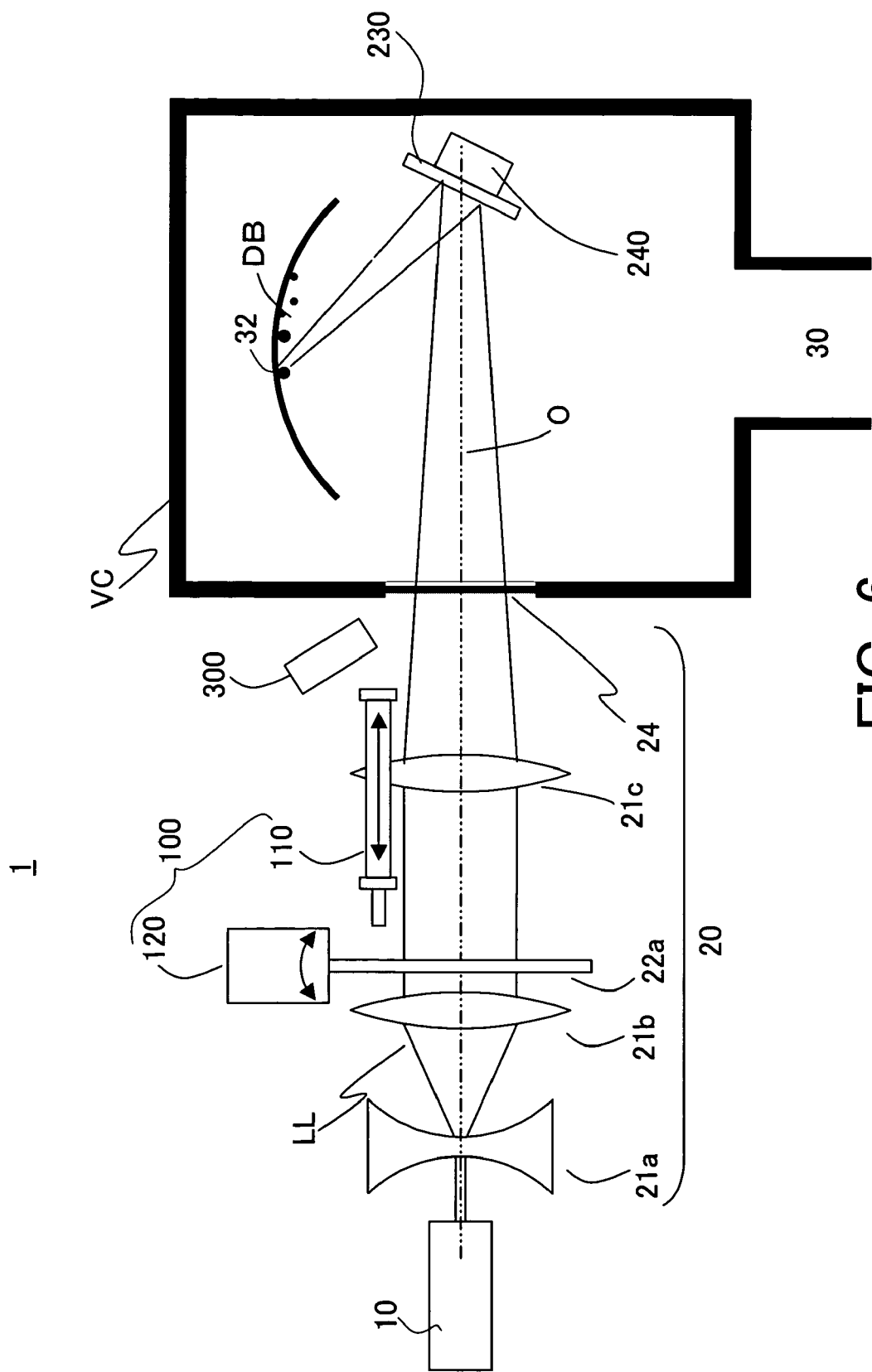
FIG. 6 is a schematic block diagram of a structure of a light generator that has a mirror that prevents a reattachment of removed debris.

As shown in FIG. 6, the debris DB that reattaches to the condenser mirror 32 can be removed by arranging and scanning the mirror 230 having the mirror drive mechanism 240. Even in removing the debris DB from the condenser mirror 32, the drive mechanism 110 moves the lens 21c in the laser optical system 20, or the irradiation condition changing means 100 changes the irradiation condition, thereby forming the optimal irradiation condition suitable for the removal of the debris DB that attaches to the condenser mirror 32. The reflection surface on the mirror 230 which reflects the laser light LL is not limited to a plane but may have a curvature. Here, FIG. 6 is a schematic block diagram of the light generator 1 having the mirror 230 that removes the debris DB that reattaches to the condenser mirror 32.

The irradiation condition of the laser light LL in removing the debris DB and the parameters of the laser light emitted from the laser light source section 10 are not always equal to that for the generation of the EUV light EL and the irradiation condition changing means 100 preferably optimizes the removal of the debris DB.

The parameters considered for the removal of the debris DB include the energy density, a wavelength, a pulse width, and an irradiation time period of the laser light LL irradiated onto the debris DB, etc. It is also necessary to consider the damages of the optical elements, such as the laser introducing window 24 and the condenser mirror 32, due to the irradiation of the laser light LL. For example, the excessively high energy density of the laser light LL heats only one point on the optical element in a short period, deforms the point due to the thermal expansion and claps at the point due to a temperature difference from the periphery.

The energy density of the laser light LL can be selected by changing an output of the laser light source section 10 or by changing a spot size of the laser light LL. The spot size of the laser light LL is variable by moving an optical element in the laser optical system 20 or a position of the laser light LL. A wavelength of the laser light LL can be selected from among the fundamental wavelengths and harmonics. For example, it is one selectable wavelength that is easily absorbed in the debris DB but is transparent to the optical element. A controller in the laser light source section 10 changes a pulse width of the laser light LL.

In order to set the irradiation condition optimal to the removal of the debris DB, the energy density of the laser light LL, a wavelength of the laser light LL, and a pulse width of the laser light LL are selected as parameters, and the optimal condition is obtained using the time necessary for the removal of the debris DB and the damage of the optical element as evaluation determinants.

The condensing condition of the laser light LL is variable by moving an optical element other than the lenses 21a to 21c in the laser optical system and by moving back and forth the laser light LL in the direction parallel to the optical axis O.

Figure 7:
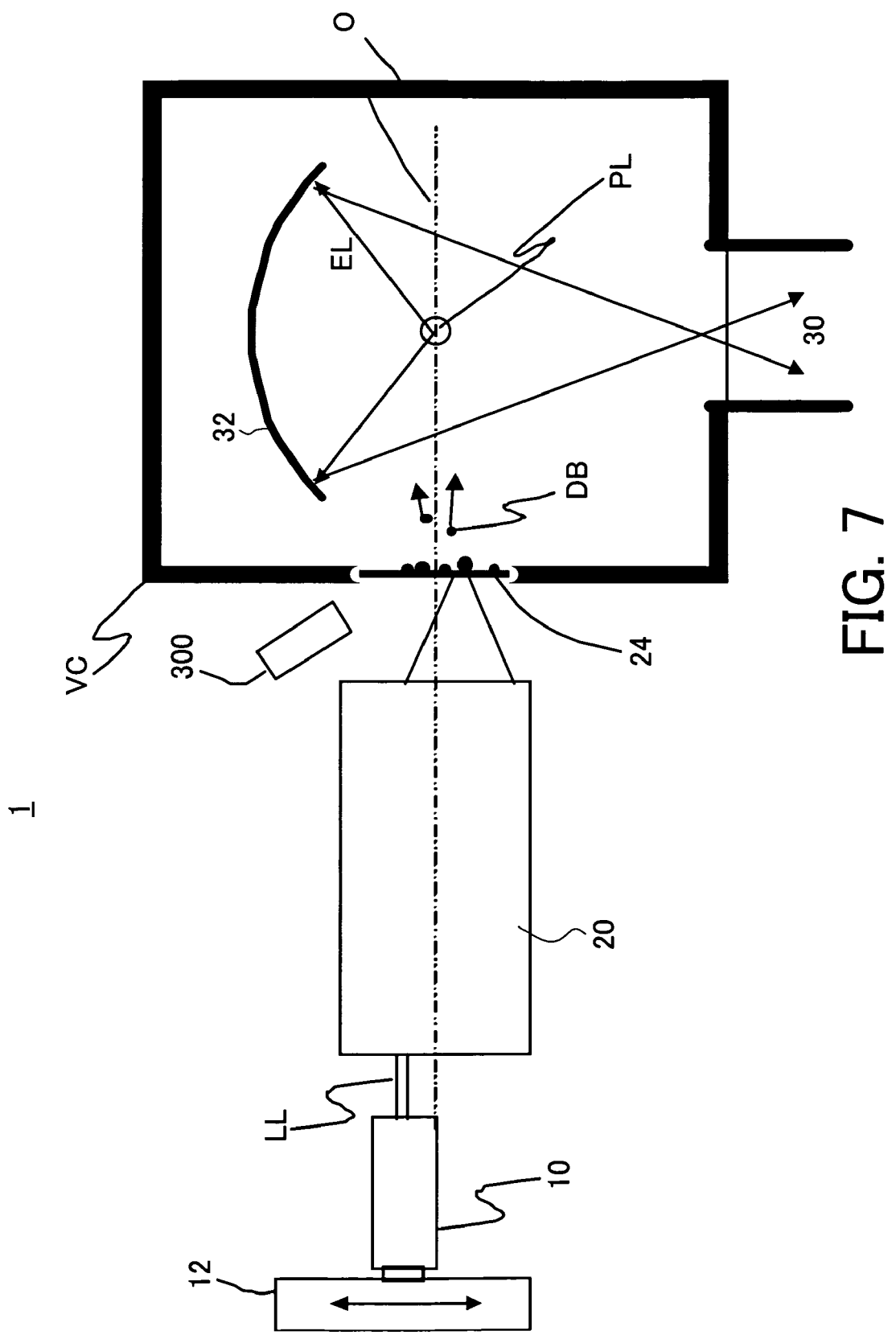
FIG. 7 is a schematic block diagram of a structure of a light generator that has a laser light source driving mechanism.
Figure 8:
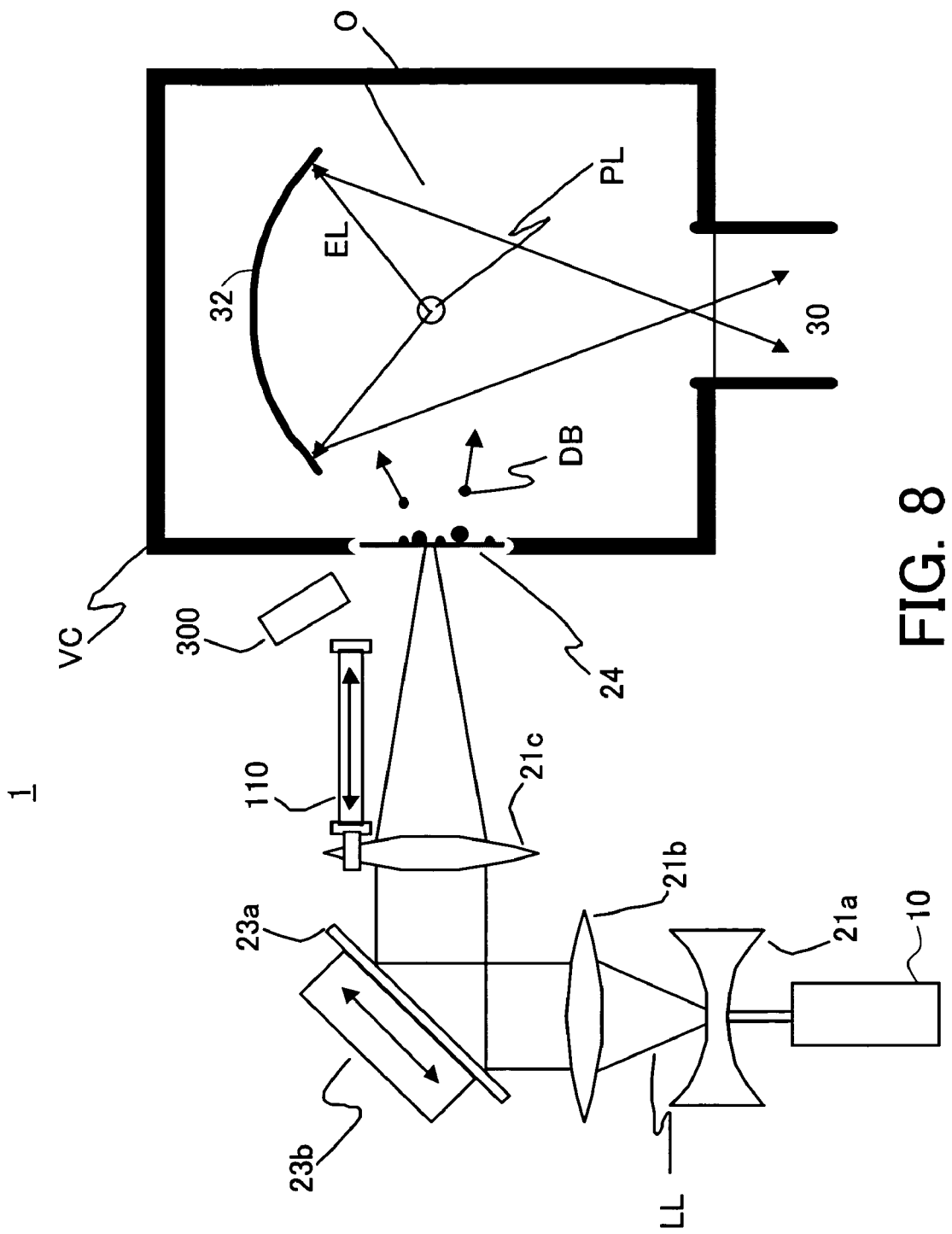
FIG. 8 is a schematic block diagram of a structure of a light generator that has a laser optical system that includes a scan mirror and a scan mechanism.

This embodiment scans an irradiation position of the laser light LL on the laser introducing window 24 by changing an angle of the plane-parallel glass plate 22a in the laser optical system 20. For example, an irradiation position of the laser light LL on the laser introducing window 24 can be scanned by moving the laser light source section 10 using the laser light source drive mechanism 12, as shown in FIG. 7, by changing an emitting angle of the laser light LL, or by providing the laser optical system 20 with a scan mirror 23a and a scan mechanism 23b that scans the scan mirror 23a as shown in FIG. 8. Here, FIG. 7 is a schematic block diagram of the structure of the light generator 1 that has the laser light source drive mechanism 12. FIG. 8 is a schematic block diagram of the structure of the light generator 1 that has the laser optical system 20 that includes the scan mirror 23a and the scan mechanism 23b.

The detecting means 300 detects the amount of the debris DB that attaches to the laser introducing window 24. Since the debris DB that attaches to and deposits on the laser introducing window 24 scatters the laser light LL, the amount of the attaching debris DB is detectable by detecting the scattered light on the debris DB using the detecting means 300. Thus, when the amount of the attaching debris DB exceeds the permissible amount, the irradiation condition changing means 100 changes the irradiation condition of the laser light LL so that the laser light LL condenses onto the attachment surface of the debris DB on the laser introducing window 24.

The detecting means 300 may be a thermometer that detects the temperature of the laser introducing window 24. When the debris DB attaches to the laser introducing window 24, its temperature rises because it absorbs part of the laser light LL. When the amount of the debris DB that attaches to the laser introducing window 24 increases, the absorption amount of the laser light LL increases and the temperature rises greatly. Thus, the amount of the attaching debris DB is detectable by detecting the temperature of the laser introducing window. Thereby, when the laser introducing window 24 reaches the predetermined temperature, the removal of the debris DB starts.

Figure 13:
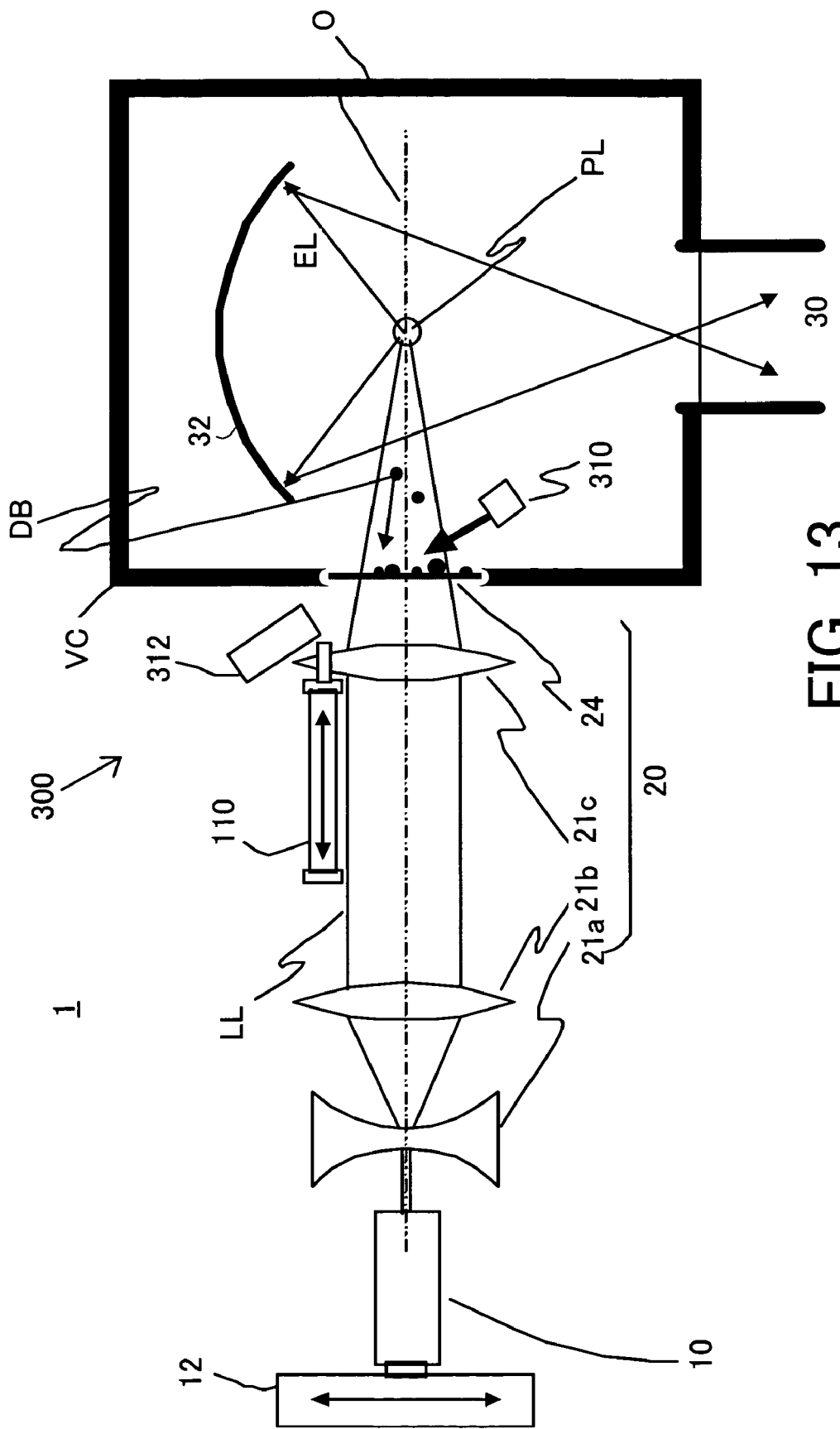
FIG. 13 is a schematic block diagram of a structure of a light generator having a detector that detects the transmission light that transmits through the debris that attaches to the laser transmitting window.

The detecting means 300 includes, as shown in FIG. 13, a detecting laser light source section 310 that emits the detecting laser so as to detect the amount of the debris DB that attaches to the laser introducing window 24, and a detector 312 that detects the detecting laser that transmits the debris DB. Since the laser introducing window 24 lowers the transmittance when the debris DB attaches to it, the amount of the debris DB is detectable by detecting the detecting laser that transmits through the debris DB. Thereby, the removal of the debris DB starts when the detecting laser that transmits the laser introducing window 24 reaches the predetermined transmittance. Here, FIG. 13 is a schematic block diagram showing the structure of the light generator 1 having the detecting means 300 that detects the transmission light that transmits through the debris DB that attaches to the laser introducing window 24.

Figure 14:
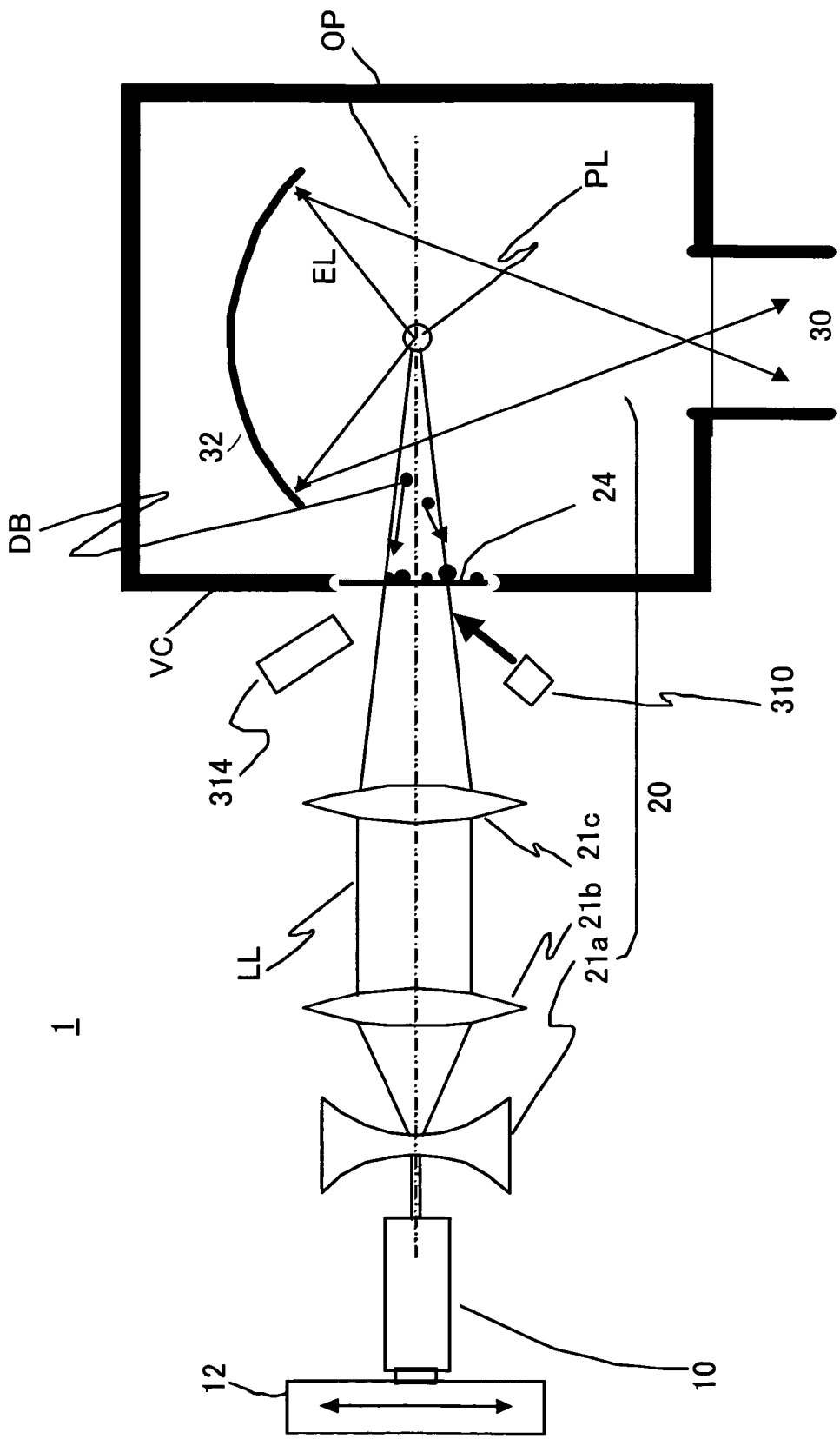
FIG. 14 is a schematic block diagram of a structure of a light generator having a detector that detects the reflected light that is reflected on the debris that attaches to the laser transmitting window.

The detecting means 300 may include, as shown in FIG. 14, a detecting laser light source section 310 that emits the detecting laser for detecting the amount of the debris DB that attaches to the laser introducing window 24, and a detector 312 that detects the detecting laser reflected on the debris DB. Since the reflected light increases on the laser introducing window 24 as the debris DB attaches to it, the amount of the debris DB is detectable by detecting the detecting laser that is reflected on the debris DB. Thereby, the removal of the debris DB starts when the detecting laser reflected on the laser introducing window 24 reaches the predetermined amount. Here, FIG. 14 is a schematic block diagram of the structure of the light generator 1 that has the detecting means 300 that detects the reflected light that is reflected on the debris DB on the laser introducing window 24.

The detecting means 300 may be a mechanism that detects a size of the plasma PL, such as a pinhole camera. When the debris DB attaches to the laser introducing window 24, the laser light LL scatters and the spot size on the target enlarges or the plasma PL's size enlarges. The removal of the debris DB starts when the amount of the debris DB that attaches to the laser introducing window 24, which is detected by the plasma PL's size, reaches the predetermined amount.

The detecting means 300 may include a mechanism that detects the intensity and wavelength of the electromagnetic wave emitted from the plasma PL, such as a photodiode having a filter. When the debris DB attaches to the laser introducing window 24, the laser light LL scatters and is absorbed by the debris DB. Therefore, the plasma PL does not have sufficiently high temperature or sufficiently high density, and the emitted electromagnetic wave' intensity and wavelength change. The removal of the debris starts when the amount of the debris DB that attaches to the laser introducing window 24, which is detected from the intensity and the wavelength of the electromagnetic waves emitted from the plasma PL, reaches the predetermined amount.

Figure 20:
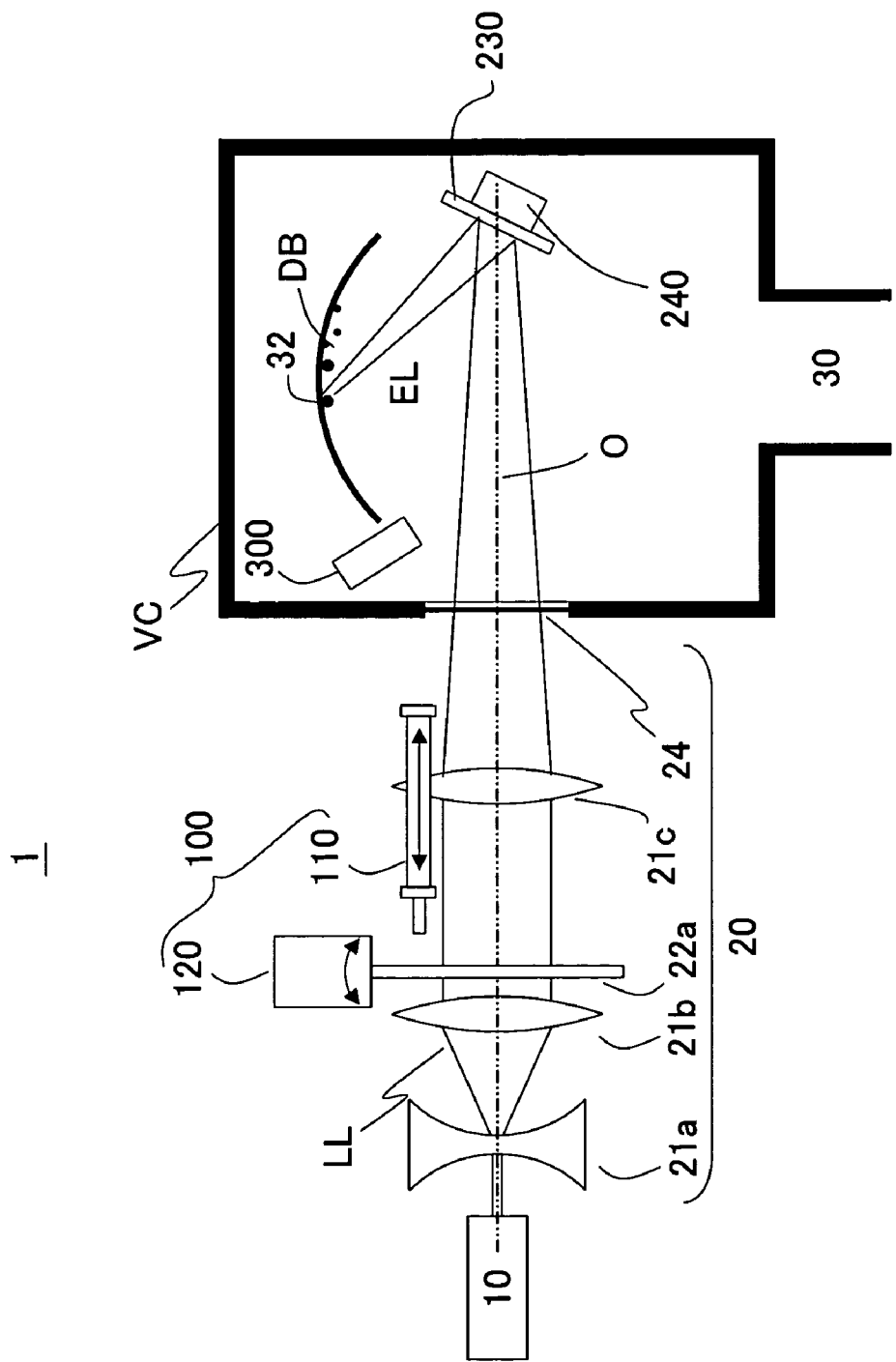
FIG. 20 is a schematic block diagram of a light generator that arranges a detector near a condenser mirror.

Since the debris DB that has been removed from the laser introducing window 24 can attach to the condenser mirror 32, the detecting means 300 may be further provided near the condenser mirror 32 as shown in FIG. 20. In this case, since it is difficult to detect the scattered light on the debris DB, the detecting means 300 may be made of a quartz resonator thickness measurer so as to detect the amount of the attaching the debris DB. Of course, the quartz resonator thickness measurer may be used to detect the amount of the debris DB that attaches to the laser introducing window 24. If the diffusion amount of the debris DB has a directional dependency, the quartz resonator thickness measurer is preferably located near the laser introducing window 24 or a relationship between the amount of the debris DB at the quartz resonator thickness measurer's position and the amount of the debris DB on the laser introducing window 24 is preferably obtained. Here, FIG. 20 is a schematic block diagram of the structure of the light generator 1 that arranges the detecting means 300 near the condenser mirror 32.

Figure 9:
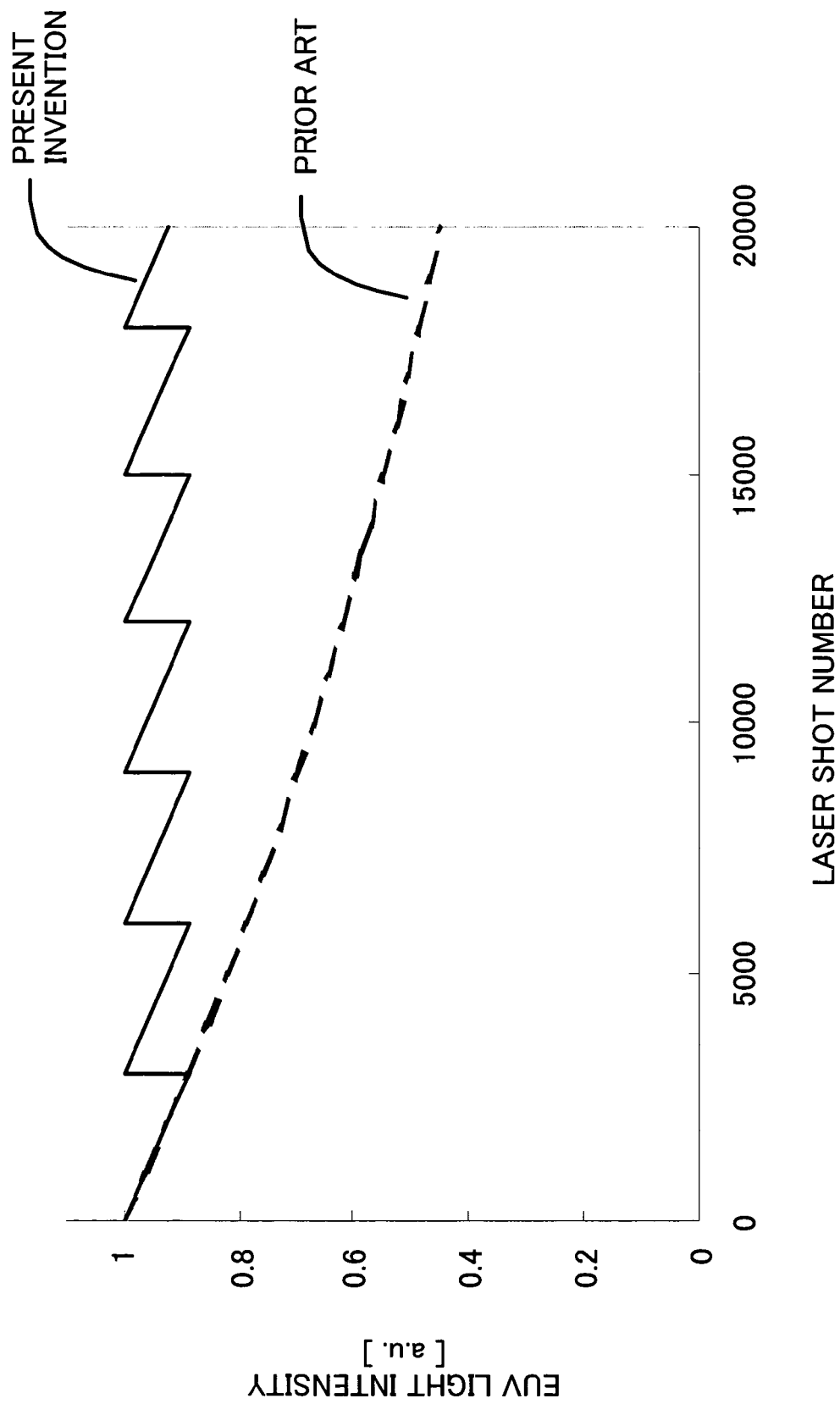
FIG. 9 is a graph showing a relationship between the EUV light intensity and the laser shot number with respect to the light generator shown in FIG. 1 and a prior art light generator.

The light generator 1 can restore the performances of the laser optical system 20 (or the laser introducing window 24) and the EUV optical system 30 (or the condenser mirror 32), which have lowered due to the attachments of the debris DB, and stably supply the EUV light. FIG. 9 shows a relationship between the shot number of the laser light LL and the EUV light EL's intensity with respect to the light generator 1 of this embodiment and the prior art light generator. Referring to FIG. 9, if the debris DB that attaches to the laser optical system 20 (or the laser introducing window 24) and the EUV optical system 30 (or the condenser mirror 32) is not removed, the light intensity of the EUV light EL lowers as the shot number of the laser light LL increases. However, the light intensity of the EUV light EL restores after the debris DB is removed.

Figure 10:
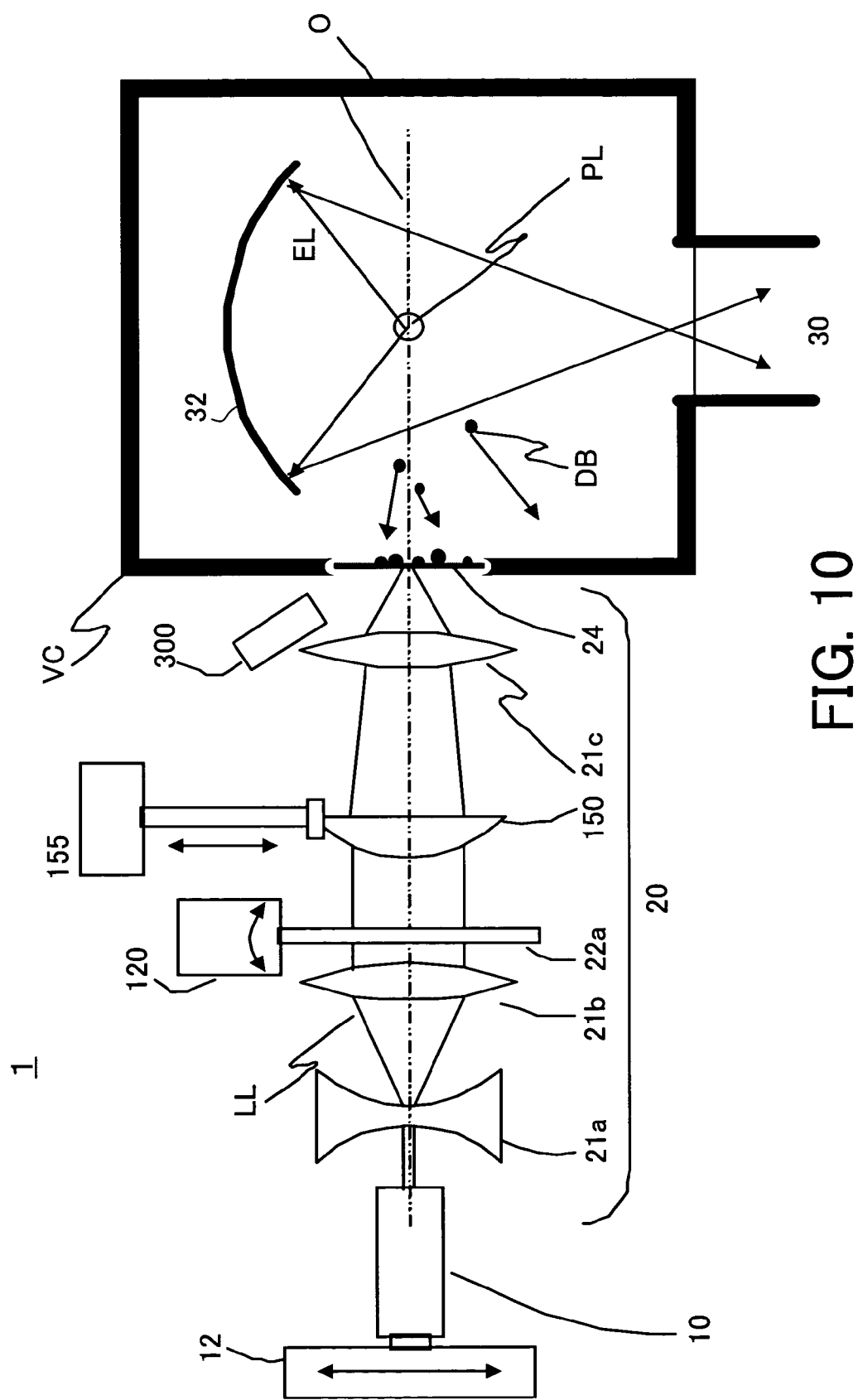
FIG. 10 is a schematic block diagram of a structure of a light generator that inserts an optical element into a laser optical system.

The irradiation condition changing means 100 may insert, as shown in FIG. 10, an optical element 150, which is not used to generate the plasma PL, into the laser optical system 20 in removing the debris DB. The optical element 150 is attached to the drive mechanism 155, and moved in the optical path of the laser light LL. Here. FIG. 10 is a schematic block diagram of the light generator 1 that inserts the optical element 150 into the laser optical system 20.

Figure 11:
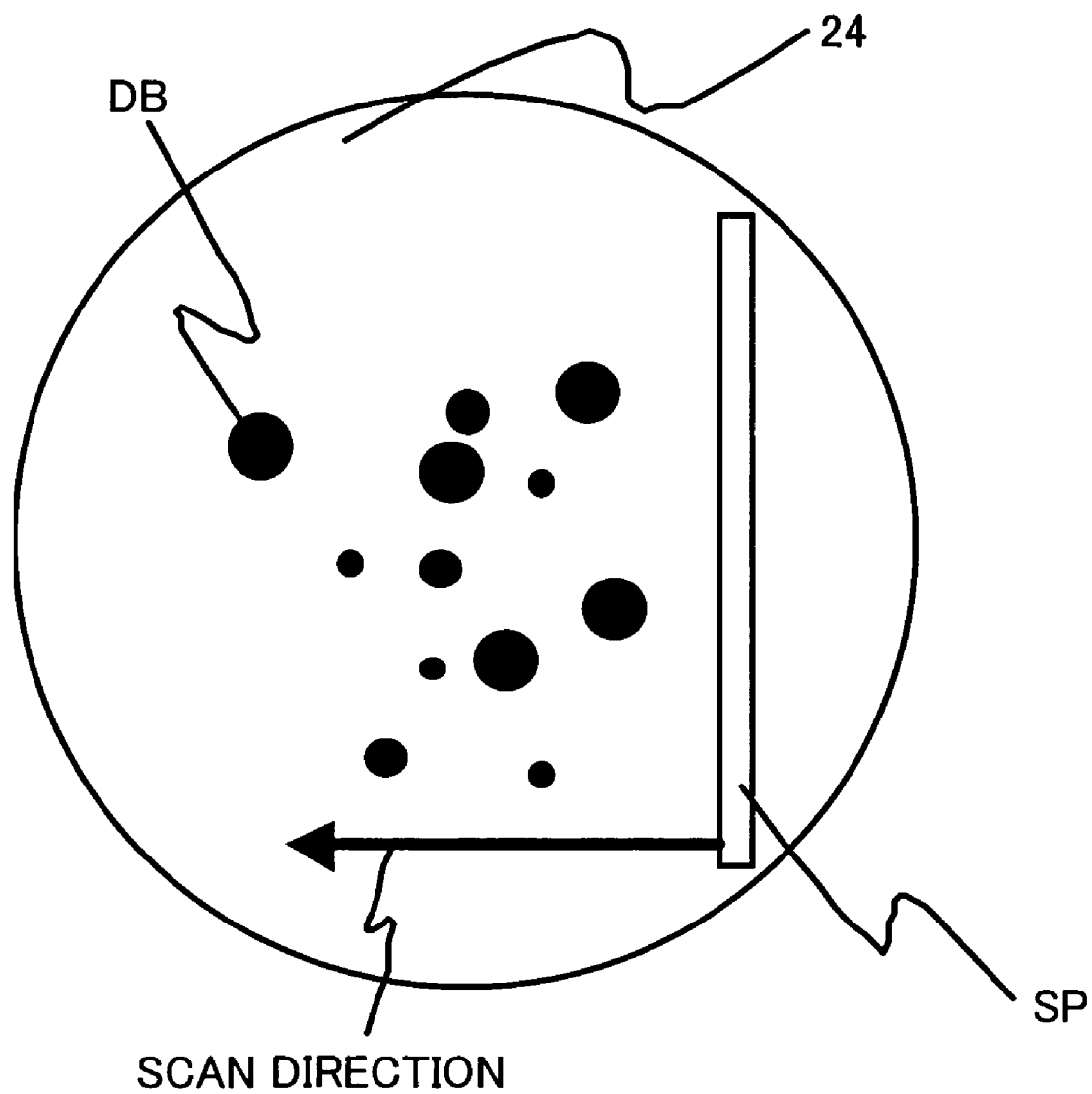
FIG. 11 is a view showing a spot shape of the laser light on a laser introducing window when a cylindrical lens as an optical element is inserted into the laser optical system.

The optical element 150 is, for example, a cylindrical lens. When the cylindrical lens is inserted, the laser light LL has a rectangular spot SP on the laser introducing window 24 as shown in FIG. 11, focuses in one direction, and having sufficient energy. The debris DB is removed by scanning this spot SP in the arrow direction shown in FIG. 11. Here, FIG. 11 is a view of a shape of the laser light LL's spot SP on the laser introducing window 24 when the cylindrical lens as the optical element 150 is inserted into the laser optical system 20.

Figure 12:
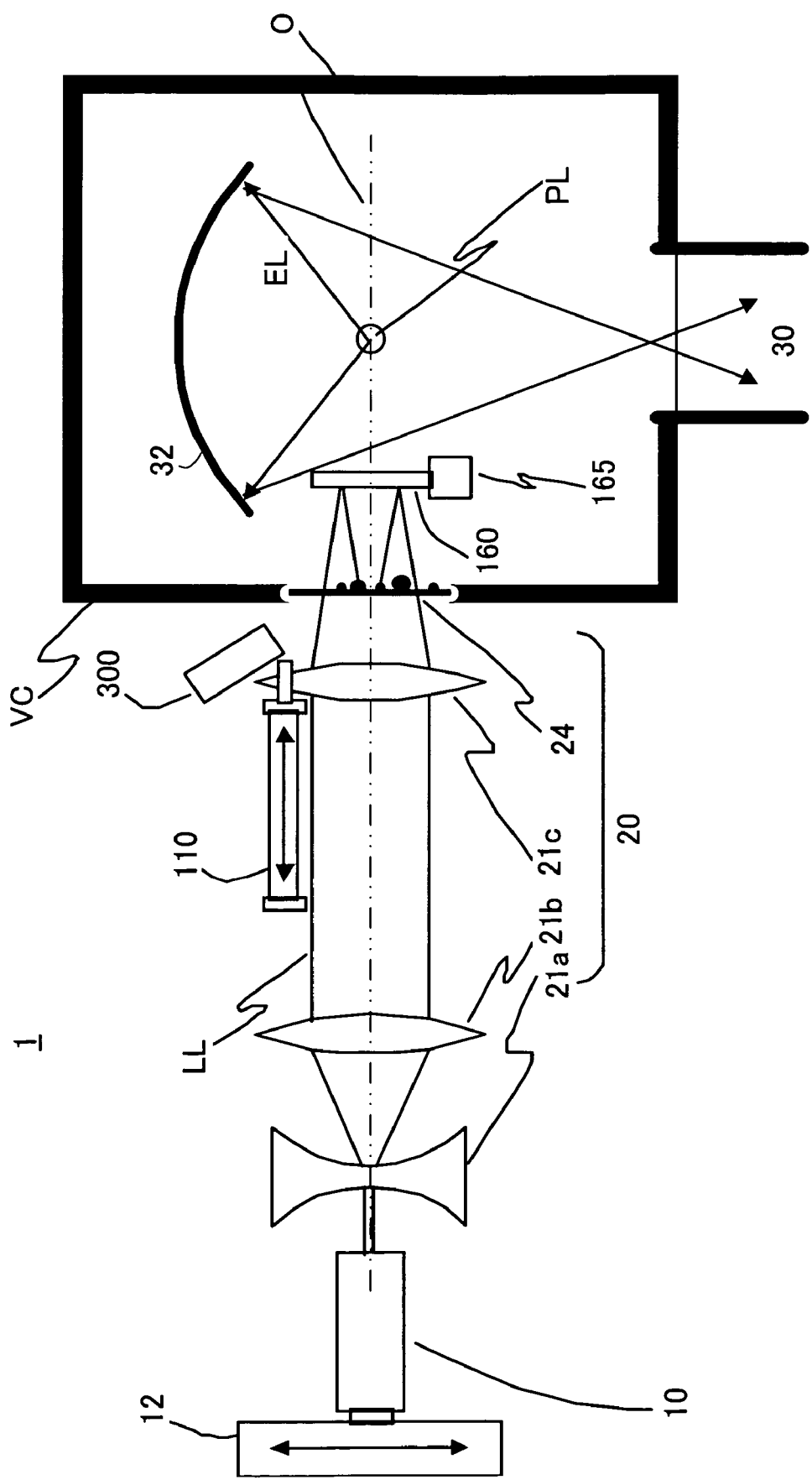
FIG. 12 is a schematic block diagram of a light generator that inserts a mirror into the laser optical system.

The optical element 150 to be inserted into the optical path of the laser optical system 20 is not limited to the cylindrical lens. For example, as shown in FIG. 12, the mirror 160 is inserted between the laser introducing window 24 to which the debris DB attaches, and the plasma PL generating position (or the target supply position). The laser light LL regularly reflects on the mirror 160 and has the energy density enough to supply sufficient energy to and remove the debris DB on the laser introducing window 24 to which the debris DB attaches. While only one point removes the debris DB on the laser introducing window 24, the debris DB is removed from the entire laser introducing window 24 as a result of that the drive mechanism 165 changes an angle of the mirror 160 and scans the laser light LL's spot on the laser introducing window 24. The mirror 160 is not limited to a plane mirror, and an insertion position is not limited to a position between the laser introducing window 24 and the plasma PL generating position. Here, FIG. 12 is a schematic block diagram of the light generator 1 that inserts the mirror 160 into the laser optical system 20.

It is preferable to set the optimal condition (with respect to the laser light LL's wavelength, energy density, irradiation time period, etc.) to remove the debris DB as discussed in inserting the optical element into the optical path of the laser light LL. The insertion of the optical element into the optical path of the laser light LL requires an optical element and a drive mechanism for driving the optical element. However, since the laser optical system 20 is not moved, the irradiation condition for generating the plasma PL is advantageously maintained.

The light generator 1 removes the debris DB that attaches to the laser optical system 20 using the laser light LL that generates the plasma PL, and stably generates the EUV light. Since the detecting means 300 can detect the degree of the deterioration of the optical element due to the attachment of the debris, the removal of the debris DB starts at the optimal timing.

Figure 15:
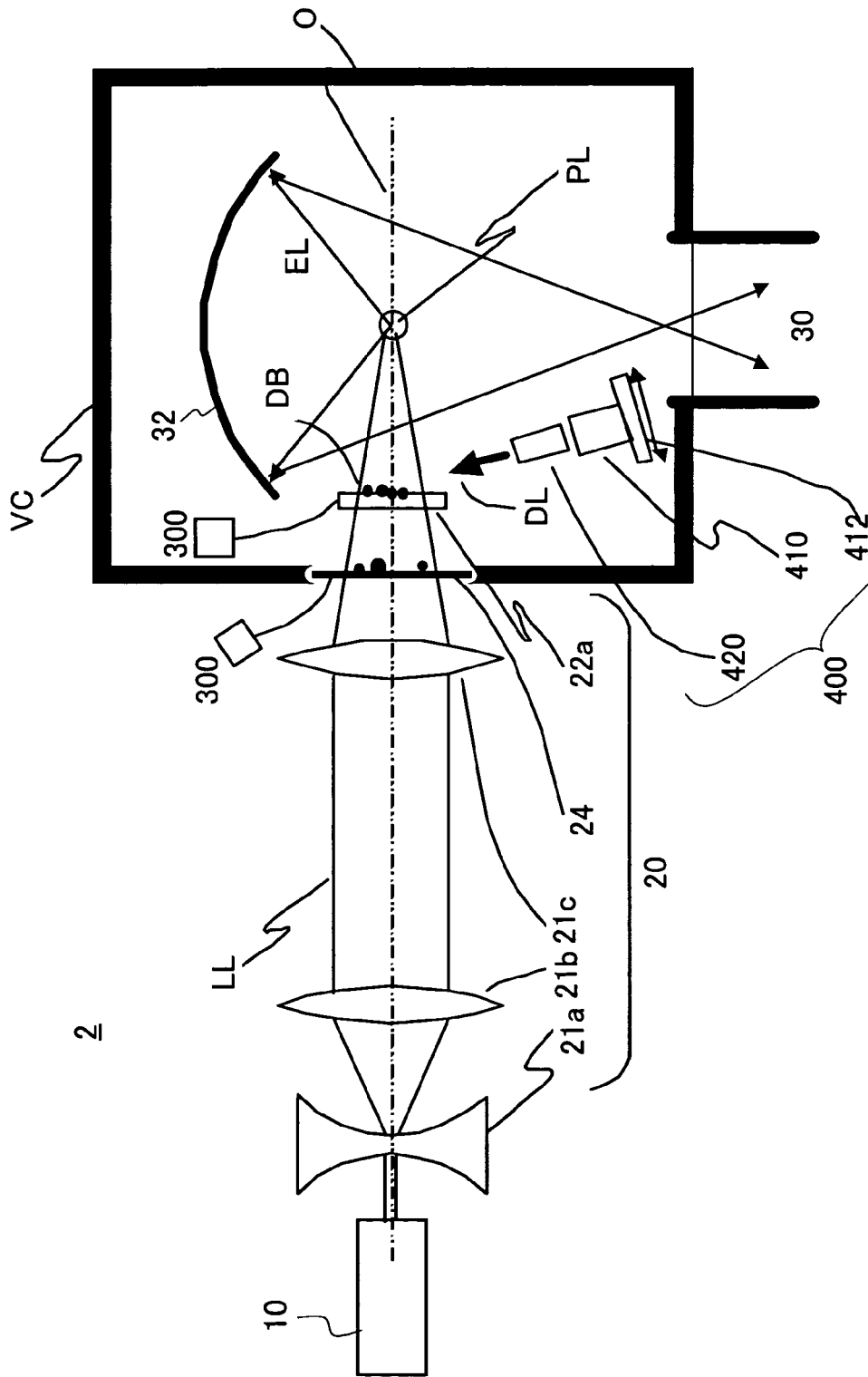
FIG. 15 is a schematic block diagram of a structure of a light generator as a variation of the light generator shown in FIG. 1.
Figure 16:
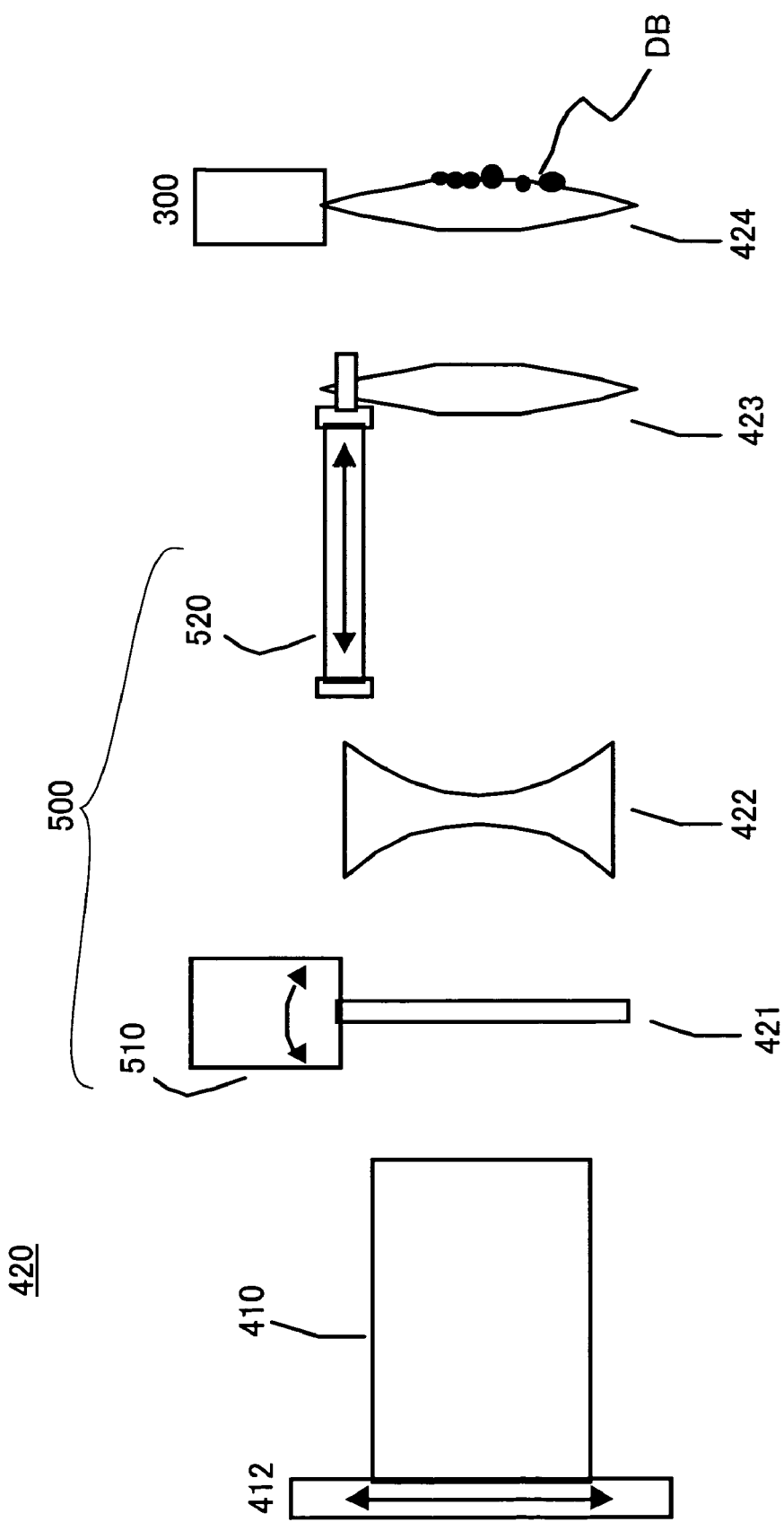
FIG. 16 is a schematic block diagram as an exemplary structure of the removing laser optical system shown in FIG. 15.

Referring now to FIGS. 15 and 16, a description will be given of the light generator 2 as a variation of the light generator 1. FIG. 15 is a schematic block diagram showing a structure of the light generator 2 as a variation of the light generator 1.

Similar to the light generator 1 shown in FIG. 1, the light generator 2 irradiates the laser light LL onto the target, generates the plasma PL, and takes out the EUV light EL from the plasma PL.

Referring to FIG. 15, the laser light LL emitted from the laser light source section 10 is condensed by the laser optical system 20, and irradiated onto the target. The energy from the laser light LL generates the high-temperature and high-density plasma PL, and this plasma PL emits the EUV light EL. The EUV light EL is condensed by the condenser mirror 32, and supplied to the subsequent optical system (EUV optical system 30). The light generator 2 further includes an irradiation mechanism 400 that irradiates the debris-removing laser light DL different from the laser light LL used to generate the plasma PL.

The irradiation mechanism 400 serves to irradiate the laser light DL onto the debris DB on the laser optical system 20 (particularly on the laser introducing window 24), and remove the debris DB, and includes a removing laser light source section 410 and a removing laser optical system 420.

The removing laser light source section 410 selects an arbitrary wavelength of the laser light DL to be emitted, such as a wavelength that is easily absorbed in the debris DB but transparent to the optical system. The number of removing laser light source sections 410 may be one or more. When the debris DB from the target and the debris DB from the target supply mechanism (not shown) have different wavelengths that are easily absorbed, the laser lights DL having these wavelengths are used.

The removing laser optical system 420 includes a lens, a mirror, a plane-parallel glass plate, etc. Although FIG. 15 arranges the removing laser light source section 410 and the removing laser optical system 420 in a vacuum, they may be located in the air.

The light generator 2 irradiates the laser light DL onto the laser optical system 20 from the removing laser light source section 410 in the irradiation mechanism 400 when the amount of the debris DB that attaches to the laser optical system (which is the plane-parallel glass plate 22a and the laser introducing window 24) exceeds the permissible amount. The debris DB that attaches to the laser optical system 20 is removed by the energy from the laser light DL. The removing laser light source section 410 includes a drive mechanism 412 and scans the laser light DL on the optical element of the laser optical system 20, and removes the debris DB from, for example, the entire plane-parallel glass plate 22a and laser introducing window 24. The irradiation condition of the laser light DL is not condensed on the optical element from which the debris DB is removed, and is preferably optimized to remove the debris DB.

This embodiment also removes the debris DB from the removing laser optical system 420 in a manner similar to the removal of the debris DB from the laser optical system 20. FIG. 16 is a schematic block diagram of a structure of the removing laser optical system 420. The removing laser optical system 420 of this embodiment includes a plane-parallel glass plate 421, lenses 422 to 424, and is connected to an irradiation condition changing means 500 that includes a drive mechanism that inclines the plane-parallel glass plate 421 relative to the optical axis of the laser light DL (not shown), and a drive mechanism 520 that drives the lens 423 in a direction parallel to the optical axis of the laser light DL (not shown). In removing the debris DB from the laser optical system 20 and the removing laser optical system 420, the irradiation condition of the laser light DL is turned to one optimal to the removal of the debris DB by changing an angle of the plane-parallel glass plate 421 and by driving the lens 423.

The irradiation condition changing means 500 may serve to insert the optical element into the optical path of the laser light DL, and insert the optical element different from the removing laser optical system 420 so as to change the irradiation condition of the laser light DL. As shown in FIG. 16, the detector 300 is configured to detect the amount of the debris DB that attaches to the removing laser optical system 420 as well as the debris that attaches to the laser optical system 20 (or the laser introducing window 24), and detect the temperature of the removing laser optical system 420, the reflected light and scattered light on the debris DB and transmission light through the debris DB.

The light generator 2 can remove the debris DB from the laser optical system 20 using the removing laser DL, and can generate the EUV light stably. Since it does not use the laser light LL for generating the plasma PL, it can remove the debris DB that attaches to the laser optical system 20 without lowering the throughput.

While the light generators 1 and 2 of the embodiments detect the amount of the debris DB that attaches to the laser optical system 20, the EUV optical system 30, and the removing laser optical system 420 using the detecting means 300, and start the debris DB when it exceeds the permissible amount, the performance deterioration of the optical system may be prevented by removing the debris DB on the regular basis instead of detecting the amount of the attaching debris DB. The timing at which the removal of the debris DB starts may be determined appropriately. The removing laser DL may emit always in the light generator 2. The time interval at which the removal of the debris DB starts preferably obtained experimentally or theoretically. For example, a relationship between the number of emissions of the laser light LL and the amount of the attaching debris DB is obtained previously, and whether the removal of the debris DB starts is determined based on the relationship. If the debris DB is always removed, the wavelength of the removing laser light DL is preferably set to a wavelength that is hard to absorb in the laser optical system 20 so as to prevent the thermal deformations of the optical element due to the temperature rise by the removing laser light DL.

Figure 17:
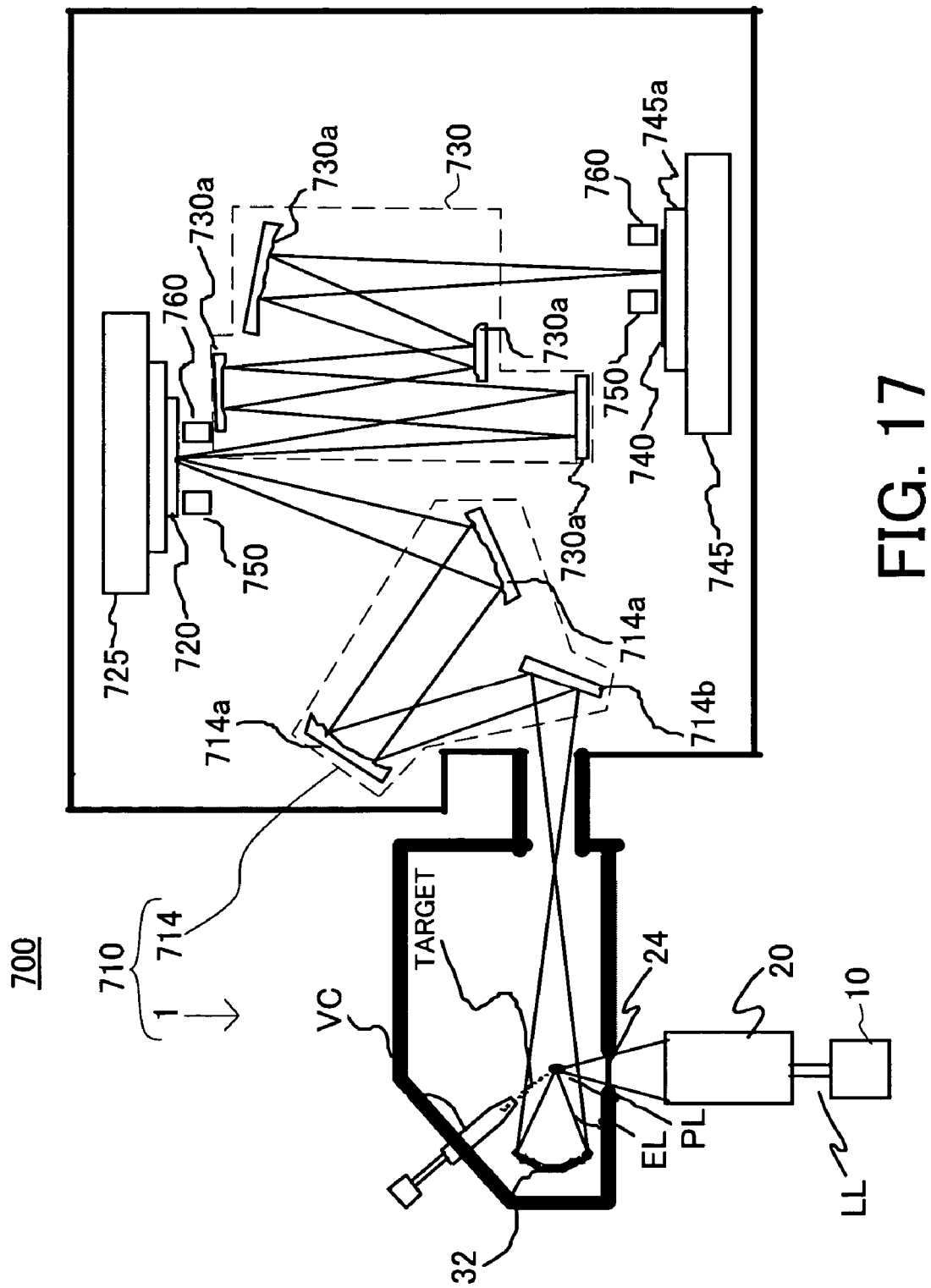
FIG. 17 is a schematic block diagram of a structure of an exposure apparatus according to one aspect of the present invention.

Referring now to FIG. 17, a description will be given of an exemplary exposure apparatus 700 that applies the inventive light generators 1 and 2. Here, FIG. 17 is a schematic block diagram of the exposure apparatus 700 according to one aspect of the present invention.

The inventive exposure apparatus 700 uses the EUV light (with a wavelength of, e.g., 13.4 nm) as illumination light for exposure, and exposes onto an object 740 a circuit pattern of a reticle 720, for example, in a step-and-scan manner or step-and-repeat manner. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 17, the exposure apparatus 700 includes an illumination apparatus 710, a reticle stage 724 mounted with a reticle 720, a projection optical system 730, a wafer stage 745 mounted with an object 740 to be exposed, an alignment detecting mechanism 750, and a focus position detecting mechanism 760.

The illumination apparatus 710 illuminate the reticle 720 using the EUV light that has a wavelength of, for example, 13.4 nm and an arc shape corresponding to an arc-shaped field of the projection optical system 730, and includes the light generator 1 and an illumination optical system 714.

The light generator 1 may apply any of the above structures, and a detailed description thereof will be omitted. While FIG. 17 exemplarily uses the light generator 1 shown in FIG. 1, the present invention is not limited to this embodiment.

The illumination optical system 714 includes a condenser mirror 714a and an optical integrator 714b. The condenser optical system serves to collect EUV light that is radiated approximately isotropically from the laser plasma, and the optical integrator uniformly illuminates the reticle 720 with a predetermined aperture.

The reticle 720 is a reflection reticle, and has a circuit pattern (or image) to be transferred. The reticle 720 is supported and driven by a reticle stage 725. The diffracted light emitted from the reticle 720 is projected onto the object 740 after reflected by the projection optical system 730. The reticle 720 and the object 740 are arranged optically conjugate with each other. Since the exposure apparatus 200 of this embodiment is a scanner, the reticle 720 and object 740 are scanned to transfer a reduced size of a pattern of the reticle 720 onto the object 740.

The reticle stage 725 supports the reticle 720 and is connected to a moving mechanism (not shown). The reticle stage 725 may use any structure known in the art. The moving mechanism (not shown) may include a linear motor etc., and drives the reticle stage 725 at least in a direction X and moves the reticle 720. The exposure apparatus 700 synchronously scans the reticle 720 and the object 740.

The projection optical system 730 uses plural multilayer mirrors 730a to project a reduced size of a pattern of the reticle 720 onto the object 740. The number of mirrors is about four to six. For wide exposure area with the small number of mirrors, the mask 720 and object 740 are simultaneously scanned to transfer a wide area that is an arc-shaped area or ring field apart from the optical axis by a predetermined distance. The projection optical system 730 has a NA of about 0.2 to 0.3.

The instant embodiment uses a wafer as the object to be exposed 740, but it may include a spherical semiconductor and liquid crystal plate and a wide range of other objects to be exposed. Photoresist is applied onto the object 740.

The object to be exposed 740 is held by the wafer stage 745 by a wafer chuck 745a. The wafer stage 745 moves the object 740, for example, using a linear motor in XYZ directions. The reticle 720 and the object 740 are synchronously scanned. The positions of the reticle stage 725 and wafer stage 745 are monitored, for example, by a laser interferometer, and driven at a constant speed ratio.

The alignment detecting mechanism 750 measures a positional relationship between the position of the reticle 720 and the optical axis of the projection optical system 730, and a positional relationship between the position of the object 740 and the optical axis of the projection optical system 730, and sets positions and angles of the reticle stage 725 and the wafer stage 745 so that a projected image of the reticle 720 may accord with the object 740.

A focus detecting optical system 760 measures a focus position on the object 740 surface, and control over a position and angle of the wafer stage 745 always maintains the object 740 surface at an imaging position of the projection optical system 730 during exposure.

In exposure, the EUV light emitted from the illumination apparatus 710 illuminates the reticle 720, and images a pattern of the reticle 720 onto the object 740 surface. The instant embodiment uses an arc or ring shaped image plane, scans the reticle 720 and object 740 at a speed ratio corresponding to a reduction ratio to expose the entire surface of the reticle 720. The light generator 1 in the illumination apparatus 710 in the exposure apparatus 700 sufficiently removes the debris, and stably generates the EUV light, and provides devices (such as semiconductor devices, LCD devices, image pickup devices (e.g., CCDs), and thin film magnetic heads) with a high throughput and good economical efficiency.

Figure 18:
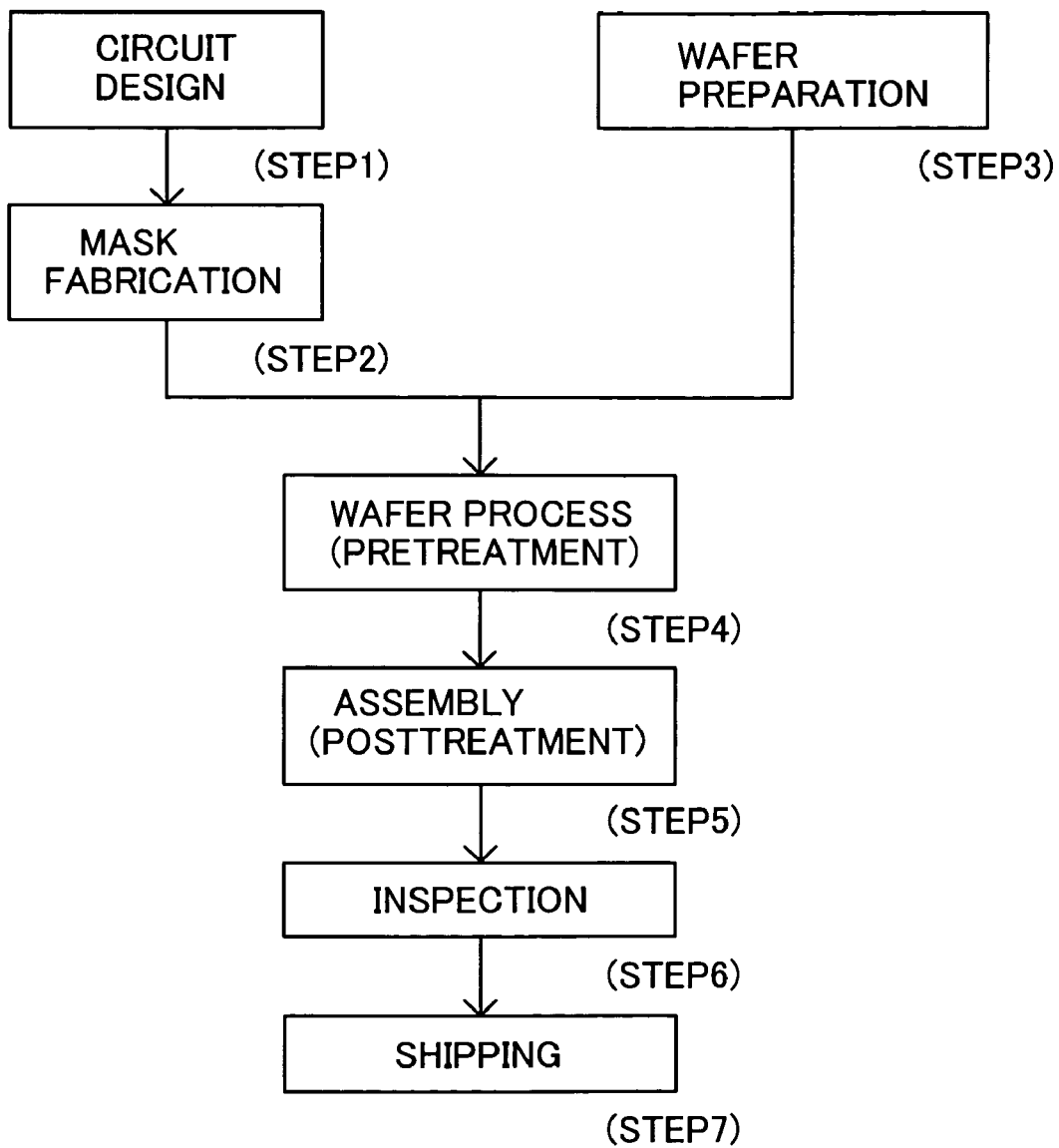
FIG. 18 is a flowchart for explaining a method for fabricating devices (semiconductor chips such as ICs, LSIs, and the like, LCDs, CCDs, etc.).
Figure 19:
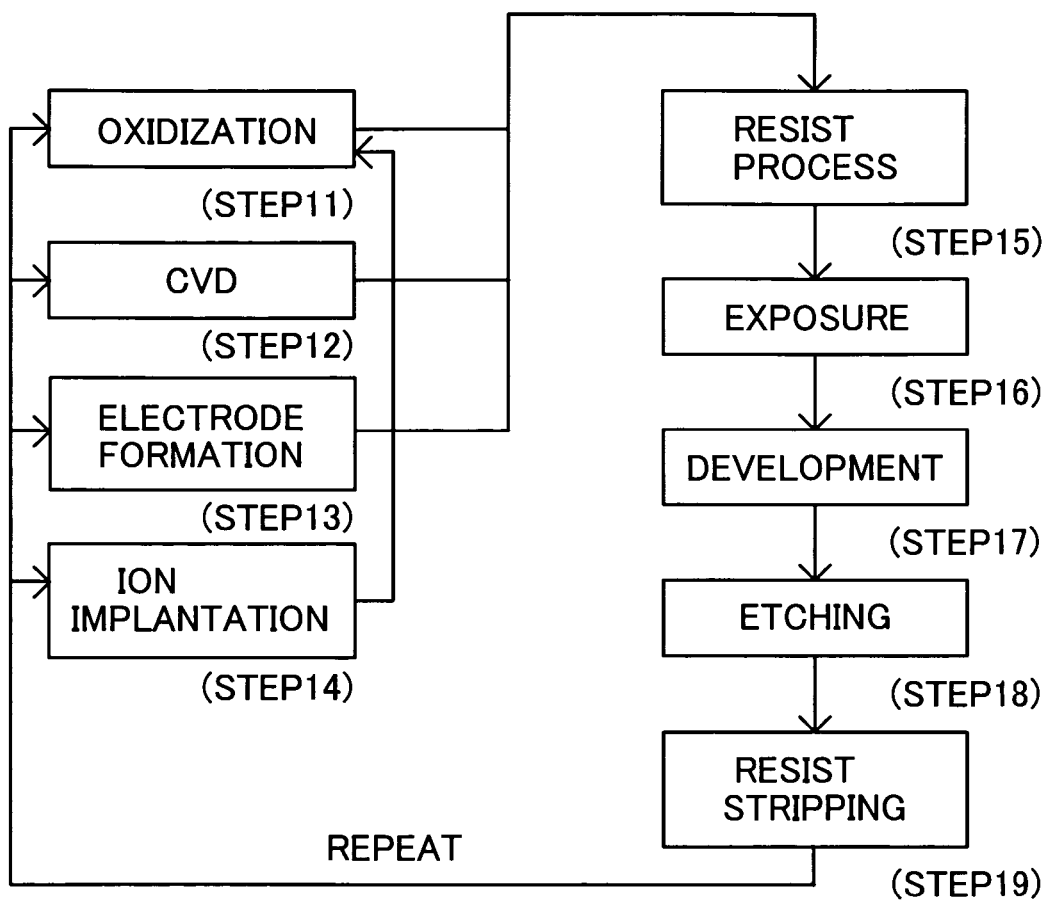
FIG. 19 is a detailed flowchart for Step 4 of wafer process shown in FIG. 18.

Referring now to FIGS. 18 and 19, a description will be given of an embodiment of a device manufacturing method using the above exposure apparatus 700. FIG. 18 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 19 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 700 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacturing method of this embodiment may manufacture a higher quality device than the conventional method.

The present invention thus can provide a light generator and exposure apparatus that satisfactorily eliminates the debris and stably generates the EUV light.

Further, the present invention is not limited to these preferred embodiments, and various variations and modifications may be made without departing from the scope of the present invention.

This application claims a foreign priority based on Japanese Patent Application No. 2004-042142, filed Feb. 18, 2004, which is hereby incorporated by reference herein.

What is claimed is:

1. A light generator for irradiating a laser onto a target, for generating plasma, and for producing light from the plasma, said light generator comprising:
a first optical system for introducing the laser to the target;
a second optical system for introducing the light; and
a unit for irradiating the laser onto debris that attaches to at least one of said first and second optical systems by changing an irradiation condition of the laser differently from that used to generate the plasma.

2. A light generator according to claim 1, wherein the irradiation condition includes a condensing position of the laser, energy density of the laser, a wavelength of the laser, a pulse width of the laser, an irradiation time period of the laser and a combination thereof.

3. A light generator according to claim 1, wherein said unit changes at least one of a position and an angle of an optical element in said first optical system.

4. A light generator according to claim 1, wherein said unit changes an output of the laser.

5. A light generator according to claim 1, wherein said unit includes a drive mechanism that changes at least one of a position and an angle of the laser.

6. A light generator according to claim 1, wherein said unit inserts an optical element into an optical path of the laser.

7. A light generator according to claim 1, further comprising a protector, located between said second optical system and said first optical system, for protecting said second optical system from the debris that has been removed from said first optical system.

8. A light generator according to claim 7, wherein said protector is drivable.

9. A light generator according to claim 1, further comprising a detector for detecting an amount of the debris that attaches to at least one of said first and second optical systems.

10. A light generator according to claim 9, wherein said detector detects the amount of the debris by detecting a temperature change of at least one of said first and second optical systems.

11. A light generator according to claim 9, wherein said detector is a quartz resonator thickness measurer.

12. A light generator according to claim 9, wherein said detector detects the amount of the debris by detecting scattered light that is scattered on the debris, the reflected light that is reflected on the debris, and transmission light that transmits through the debris.

13. A light generator according to claim 9, wherein said detector detects the amount of the debris based on a size of the debris.

14. A light generator according to claim 9, wherein said detector detects the amount of the debris based on a light intensity emitted from the plasma.

15. A light generator according to claim 9, wherein the light has a wavelength of 20 nm or smaller.

16. A light generator for irradiating an excitation laser onto a target in a vacuum, for generating plasma, and for producing light from the plasma, said light generator comprising:
an optical system for introducing the excitation laser to the target; and
an irradiation mechanism for irradiating a laser different from the excitation laser onto debris that attaches to said optical system.

17. A light generator according to claim 16, further comprising a unit for changing a condensing condition of the laser irradiated by said irradiation mechanism.

18. A light generator according to claim 17, wherein said unit includes a drive mechanism for changing a position and an angle of an optical element that introduces the laser irradiated by said irradiation mechanism onto the debris.

19. A light generator according to claim 16, further comprising a detector for detecting an amount of the debris that attaches to said optical system.

20. A light generator according to claim 19, wherein said detector detects the amount of the debris by detecting a temperature change of said optical system.

21. A removing method for removing debris that is generated together with light having a wavelength of 20 nm or smaller from plasma as a result of irradiating a laser onto a target and generating the plasma, said removing method comprising the steps of:
detecting an amount of the debris that attaches to an optical system for introducing the laser to the target;
changing a condensing condition of the laser when the amount of the debris detected by said detecting step is greater than a predetermined amount; and
irradiating the laser having the condensing condition changed by said changing step, onto a position to which the debris attaches.

22. A removing method for removing debris that is generated together with light having a wavelength of 20 nm or smaller from plasma as a result of irradiating a laser onto a target and generating the plasma, said removing method comprising the steps of:
obtaining a relationship between the number of emissions of the laser and an amount of the debris that attaches to the optical system for introducing the laser to the target;
determining, based on the relationship, whether the debris that attaches to the optical system should be removed;
changing a condensing condition of the laser when said determining step determines that the debris that attaches to the optical system should be removed; and
irradiating the laser having the condensing condition changed by said changing step, onto the debris that attaches to the optical system.

23. An exposure apparatus for exposing a pattern of a reticle onto an object, said exposure apparatus comprising:
a light generator according to claim 1; and an optical system for illuminating the reticle using light taken by said light generator.

24. A device manufacturing method comprising the steps of:
exposing an object to be exposed using an exposure apparatus; and
developing the object exposed,
wherein said exposure apparatus includes:
a light generator according to claim 1; and
an optical system for illuminating the reticle using light taken by said light generator.

\* \* \* \* \*